United States Patent [19]

Sanpei et al.

[11] Patent Number: 5,581,446
[45] Date of Patent: Dec. 3, 1996

[54] HOUSING STRUCTURE OF ELECTRIC APPLIANCE AND DISASSEMBLING METHOD THEREOF

[75] Inventors: Kazuo Sanpei; Tatsuo Yamauchi, both of Koriyama, Japan

[73] Assignee: Hitachi Telecom Technologies Ltd., Koriyama, Japan

[21] Appl. No.: 551,938

[22] Filed: Oct. 23, 1995

Related U.S. Application Data

[63] Continuation-in-part of Ser. No. 127,568, Sep. 28, 1993, Pat. No. 5,461,543.

[30] Foreign Application Priority Data

| Sep. 28, 1992 | [JP] | Japan | 4-281094 |
| Sep. 28, 1992 | [JP] | Japan | 4-281095 |
| Sep. 28, 1992 | [JP] | Japan | 4-281096 |
| May 18, 1993 | [JP] | Japan | 5-138922 |

[51] Int. Cl.$^6$ .................................................. H05K 5/00
[52] U.S. Cl. ................................... 361/755; 206/324
[58] Field of Search .................................. 206/328, 334; 220/4.21, 4.24, 315, 324; 361/725–732, 741–742, 747, 752, 755–759, 796, 800–802

[56] References Cited

U.S. PATENT DOCUMENTS

| 4,226,491 | 10/1980 | Kazama et al. | 361/759 |
| 4,672,510 | 6/1987 | Castner | 361/796 |
| 5,144,533 | 9/1992 | Annett | 361/759 |

*Primary Examiner*—Gregory D. Thompson
*Attorney, Agent, or Firm*—Foley & Lardner

[57] ABSTRACT

A housing structure of an electric appliance has an upper case and a lower case. The upper case is provided with a plurality of logic holding portions arranged on inner sides of left and right side face portions of the upper case. An interior one of the logic holding portions has a protrusion engagement portion which is defined by a slant face and a front face of the interior holding portion. The lower case is provided with a lower case side engagement portion which engages releasibly with the protrusion engagement portion. The lower case side engagement portion has a resilient half portion in a half support which is formed on a bottom face of the lower case and on which an extrusion portion that engages releasibly with the protrusion engagement portion and a threaded hole for a screw are formed. The housing structure is disassembled by screwing the screw into the threaded hole so that the screw's end portion contacts slidably with the slant face of the interior logic holding portion so as to move the resilient half portion downwardly away from the upper case to thereby release the engagement of the extrusion portion from the protrusion portion.

5 Claims, 26 Drawing Sheets

HOUSING STRUCTURE OF ELECTRIC APPLIANCE AND DISASSEMBLING METHOD THEREOF

RELATED APPLICATIONS

This application is a continuation-in-part of application Ser. No. 127,568, filed Sep. 28, 1993 now U.S. Pat. No. 5,461,543.

BACKGROUND OF THE INVENTION

1. Field of the Invention

The present intention relates to a housing structure of an electric appliance, such as telephones and facsimiles for carrying out information communication through telephone lines, or other electric appliances of a box type, and a disassembling method thereof.

2. Description of the Prior Art

According to the conventional electric appliance such as communication terminal apparatus for carrying out information communication by means of telephone lines, the housing of the appliance is made of conductor material such as metal plate as shown in FIG. 31. A logic package (d) is placed in an upper case (a) having a plurality of bosses (c) and a lower case (b) of an L-shape secured thereto. An indication panel (e) is attached to a front portion of the upper case (a), and a push button (g) is installed on an electric key (f) mounted on the logic package (d).

According to the conventional electric appliance, the upper case (a) as described above is made of metal plate or sheet, so that a number of manufacturing steps are necessary and workability of the appliance assembling is low since the lower case (b) is secured to the upper case (a) through a number of bosses (c) and screws (h).

SUMMARY OF THE INVENTION

According to the housing structure of an electric appliance of the present invention, the electric appliance comprises an upper case provided with a plurality of holding portions arranged on inner sides of the left and right side face portions of the upper case in front-and-rear directions at a regular interval, a first upper case side engagement portion formed on at least the middle one of the plurality of holding portions (e.g. one of the holding portions other than the frontmost and the rearmost holding portions), and a second upper case side engagement portion, and a lower case provided with a first lower case side engagement portion to engage releasibly with the first upper case side engagement portion, the engagement being released by means of turning a screw, a second lower case side engagement portion to engage releasibly with the second upper case side engagement portion, and hooks, formed at the front portions of the left and the right sides of the lower case, which are adapted to hook the frontmost holding portions in order to position the lower case to overlap with the upper case such that pushing the lower case forward against the upper case results in an engagement of the first upper case side engagement portion with the first lower case side engagement portion and the second upper case side engagement portion with the second lower case side engagement portion.

Additionally, the first upper case side engagement portion of the upper case has a slant face formed on an end face of the middle holding portion. The slant is in a rearward direction and forms a protrusion engagement portion with the front face of the middle holding portion. The first lower case side engagement portion of the lower case has a resilient half portion in a half support which is formed on the bottom face of the lower case and on which an extrusion portion that engages releasibly with the protrusion engagement portion and a threaded hole for a screw are formed.

Also, according to the method of disassembling the housing structure of the electric appliance of the present invention, the electric appliance having an upper case provided with a plurality of holding portions arranged on inner sides of the left and the right side face portions of the upper case in front-and-rear directions at a regular interval and a first upper case side engagement portion, formed on at least the middle one of the plurality of holding portions, which has a rearwardly slanted face formed on an end face of the middle holding portion, the slanted face and the front face of the middle holding portion forming a protrusion engagement portion, and a lower case provided with a first lower case side engagement portion which has a resilient half portion in a half support which is formed on the bottom face of the lower case and on which an extrusion portion to engage releasibly with the protrusion engagement portion and a threaded hole for a screw are formed, is disassembled by inserting the screw into the threaded hole, turning the screw into the threaded hole so that an end portion of the screw contacts slidably onto the slant face so as to move the resilient half portion downwardly away from the upper case, thereby releasing the engagement of the extrusion portion with the protrusion engagement portion so that it is then possible to move rearwardly the lower case in relation to the upper case, and pulling out the lower case from the upper case resulting in dismounting of the lower case from the upper case.

Consequently, it is the first purpose of the present invention to provide a housing structure of an electric appliance which does not use any screws to assemble the housing, but still fixes rigidly the upper case to the lower case.

It is the second purpose of the present invention to provide a housing structure of an electric appliance which improves the assembling and the disassembling workability.

Also, it is the third purpose of the present invention to provide a method of disassembling a housing structure of an electric appliance which improves the disassembling workability by dismounting the housing of an upper case from a lower case by means of a screw provided in the lower case.

The characteristics of the electric appliance according to the present invention will be made apparent from reading the following description with reference to the accompanying drawings.

DETAILED DESCRIPTION OF THE PREFERRED EMBODIMENTS

Figure 6:
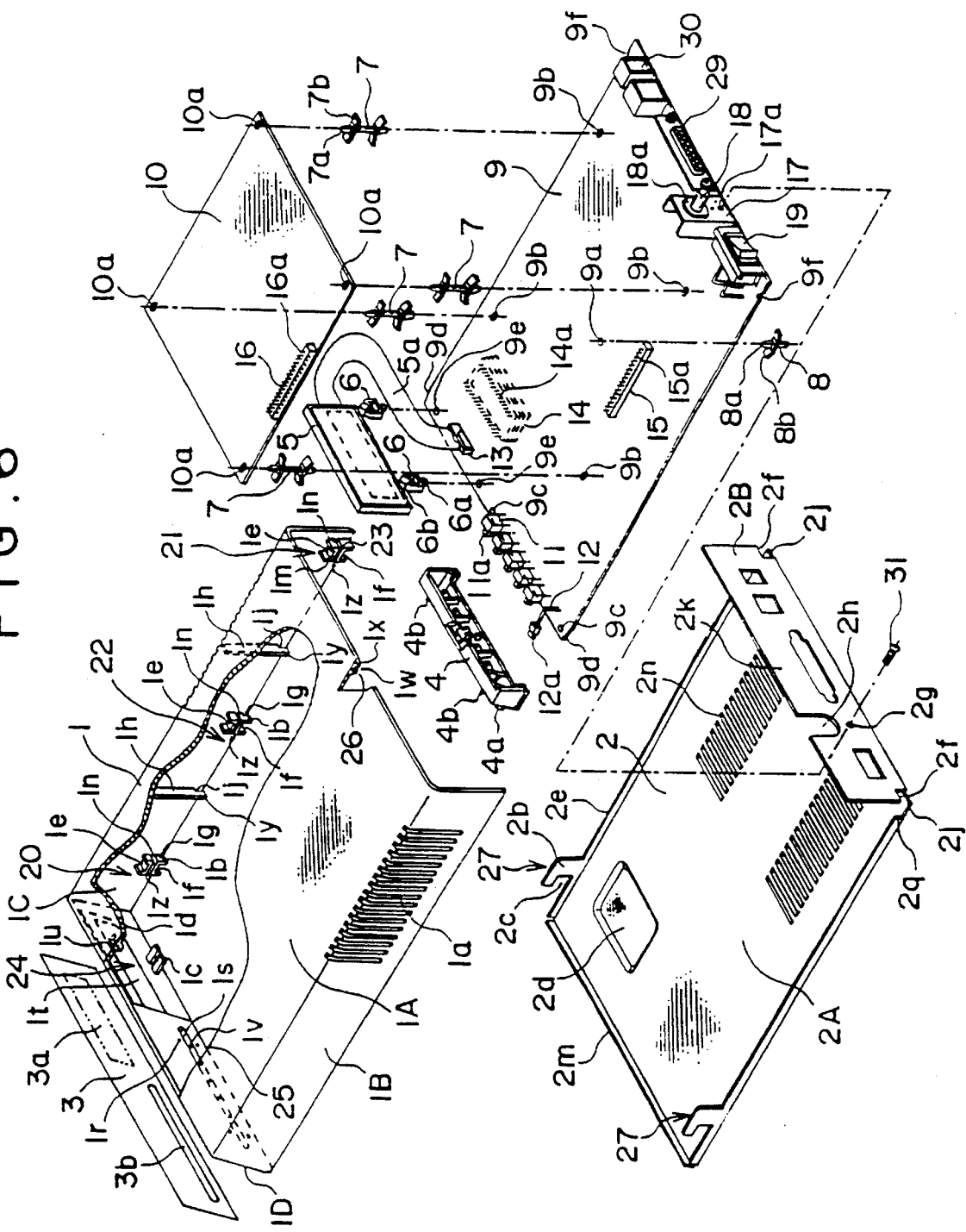
FIG. 6 is an exploded perspective view of the electric appliance.

Referring to FIG. 6, the electric appliance according to the present invention is structured with a plastic-made upper case 1, a metal-made lower case, indication panel 3, push button unit 4, and logic packages 9 and 10.

Figure 7:
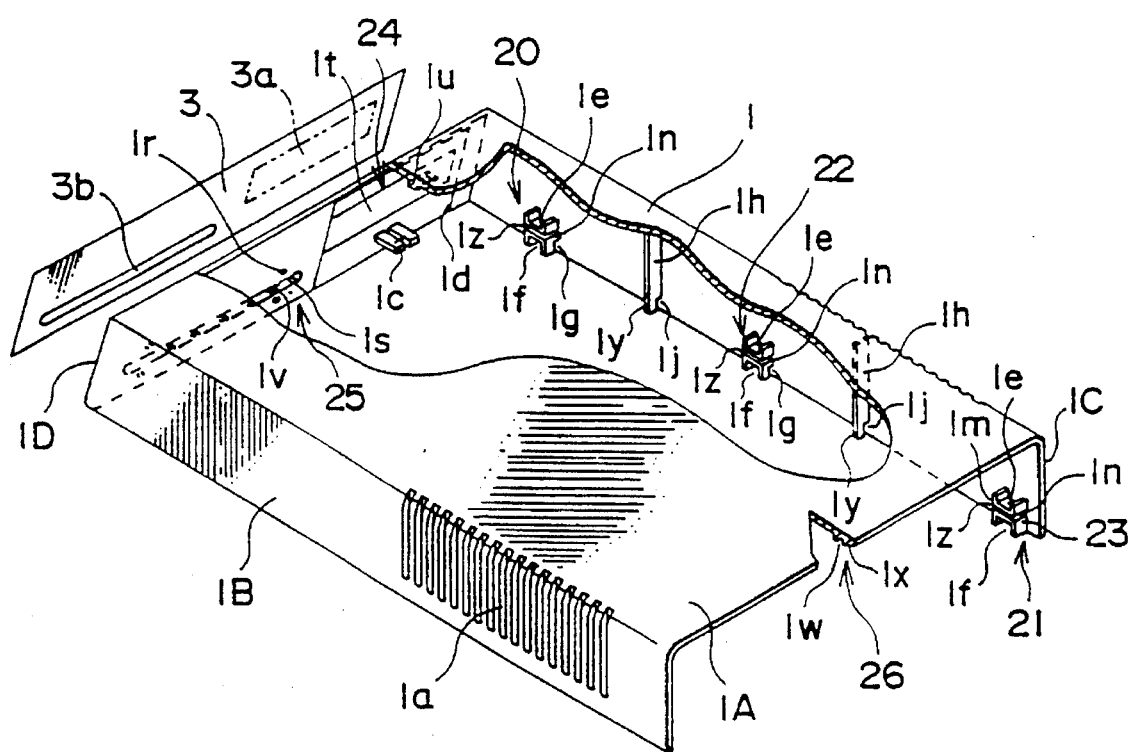
FIG. 7 is a perspective view of the upper case of the appliance.

As shown in FIG. 7, the upper case 1 has an upper face portion 1A, left and right side face portions 1B, 1C, and a front face portion 1D, but no rear face portion. The front face portion 1D is a slanted face inclined downward.

The left side portion 1B has heat radiation slots 1a and the left and right side face portions 1B and 1C have logic package holding portions 20, 21, and 22, respectively formed at front, rear, and center positions of the inner face portions of the side face portions as to protrude from the upper case 1.

Figure 16:
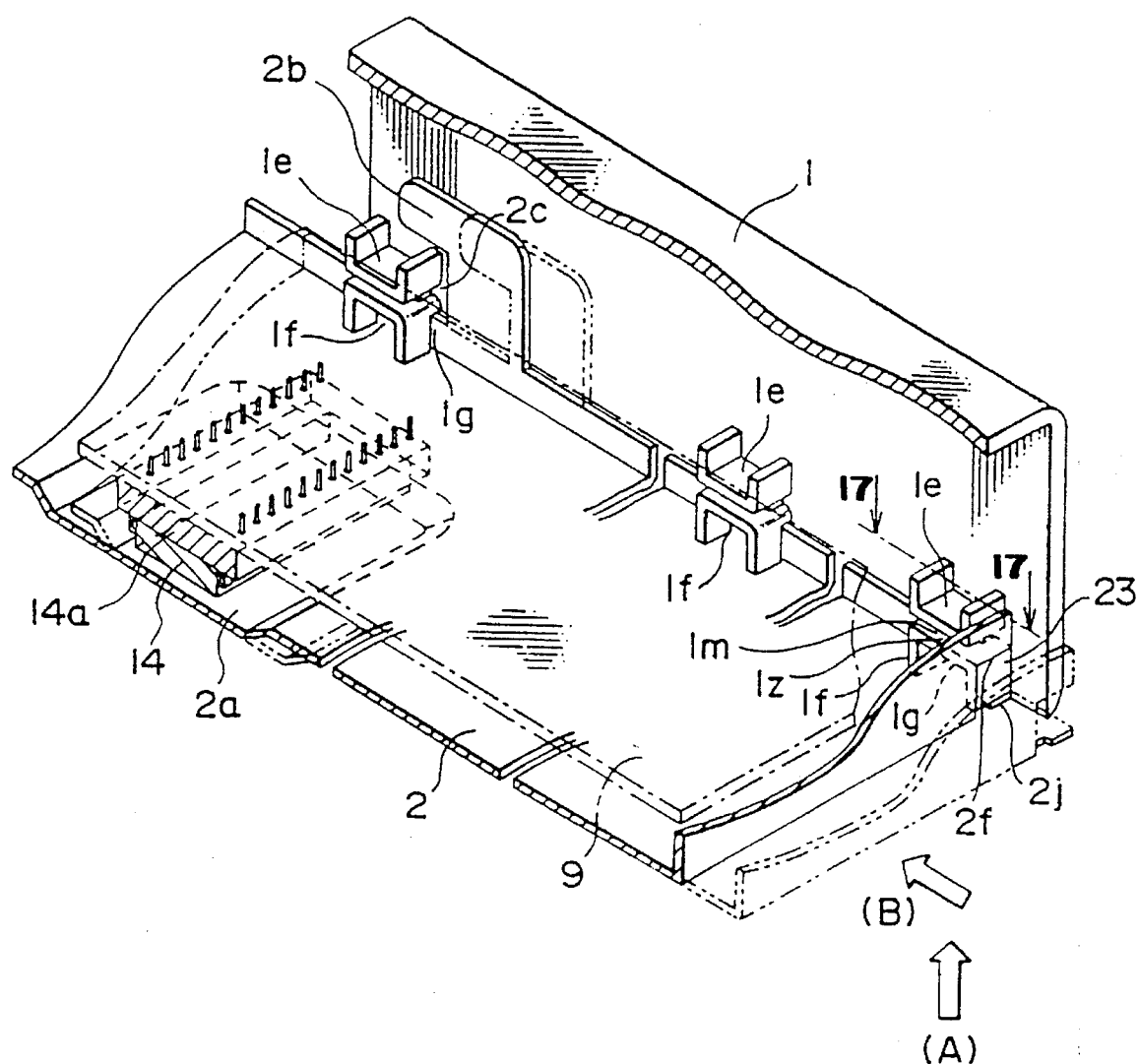
FIG. 16 is a perspective showing engagement condition of the upper case and lower case.
Figure 17:
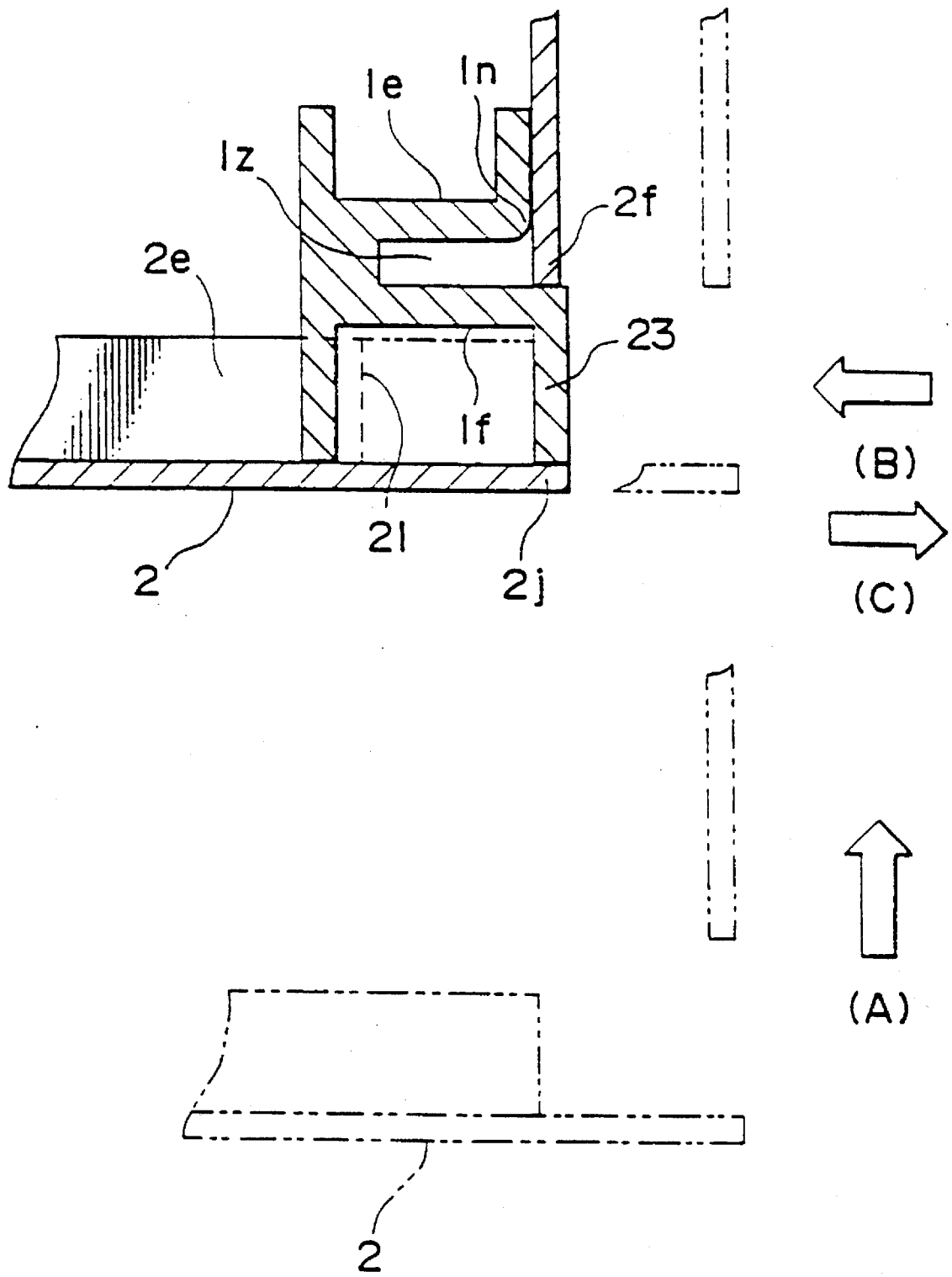
FIG. 17 is a section taken along line 17—17 of FIG. 16.
Figure 21:
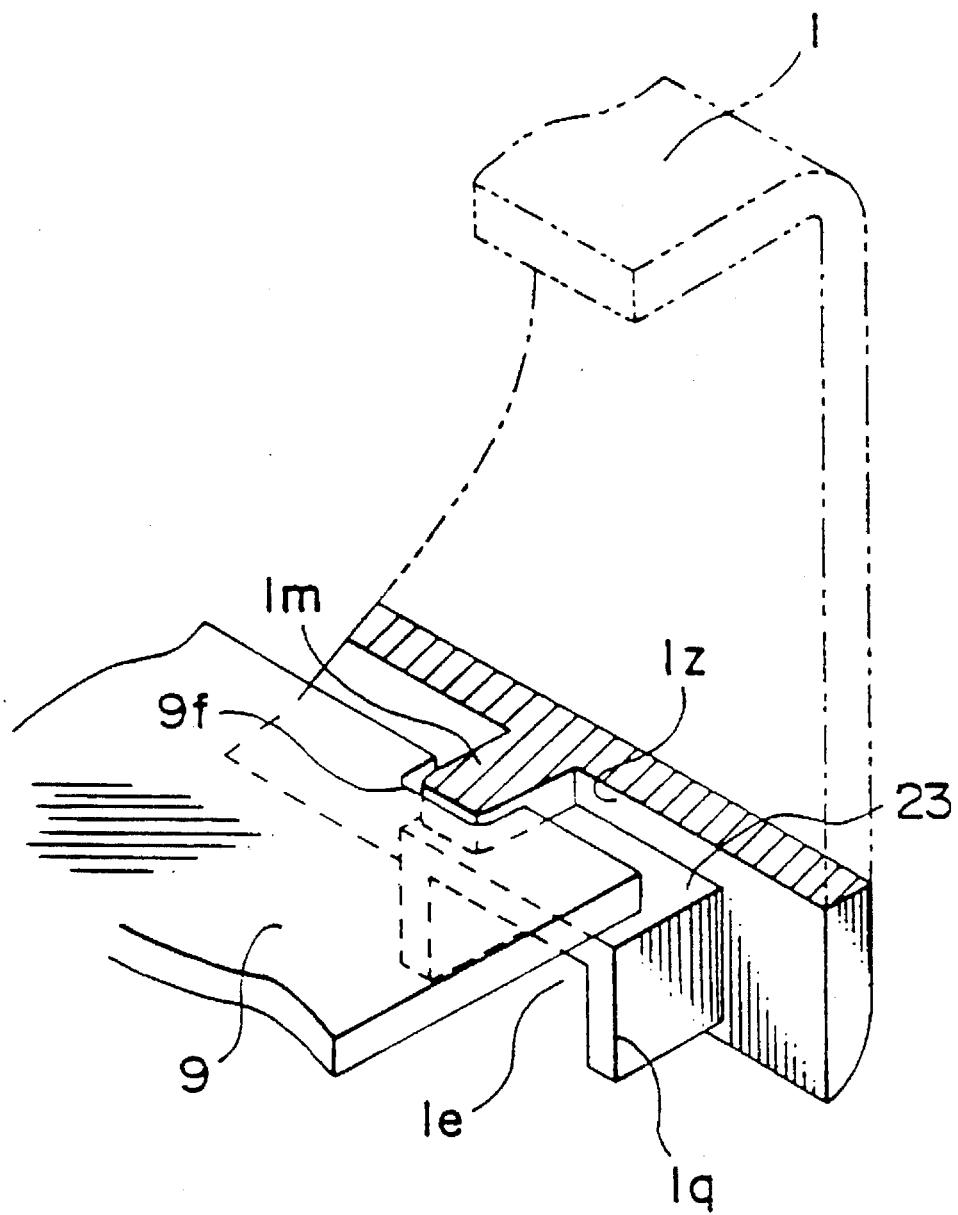
FIG. 21 is a section taken along line 21—21 of FIG. 20.

The front and central logic package holding portions 20 and 22 have the same structure. They are structured or combined by combining both upper and lower shape protrusions 1e and 1f back to back leaving a guide groove 1z between them, and leaving an insertion groove 1g between the lower shape protrusion 1f and inner face portions of the left and right side face portions 1B and 1C. The rear side logic package holding portion 21 is assembled as shown in FIGS. 7, 16 and 17 by combining the upper and lower shape protrusions 1e and 1f back to back and leaving the guide groove 1z between them and the insertion groove 1g between the lower shape protrusion 1f and the inner face portions of the left and right side face portions 1B and 1C. A rear portion of the lower shape protrusion 1f is then protruded rearward from the upper shape protrusion 1e forming a protruded or stepped portion of an engagement portion 23 for the upper case side engagement portion. Also, an engagement protrusion 1m is formed, as shown in FIG. 21, at the front portion of the guide groove 1z so as to engage with the notch 9f of the logic package 9.

The inner face portions of the left and right side face portions 1B and 1C also have front and rear longitudinal ribs 1h and these longitudinal ribs 1h have lower ribs 1y leaving gaps 1j.

A front face portion 1D of the upper case 1 has a liquid crystal indicator containing portion 24 for securely containing liquid crystal indicators (LCD) 5 and a push button unit installation portion 25 on which the push button unit 4 is mounted.

The liquid crystal indicator container or containing portion 24 has a rectangular opening 1t, a stepped portion 1d formed around the circumference of the rectangular opening 1t, and protrusion 1u and 1c placed above and below the opening 1t sandwiching liquid crystal indicators 5.

Figure 15:
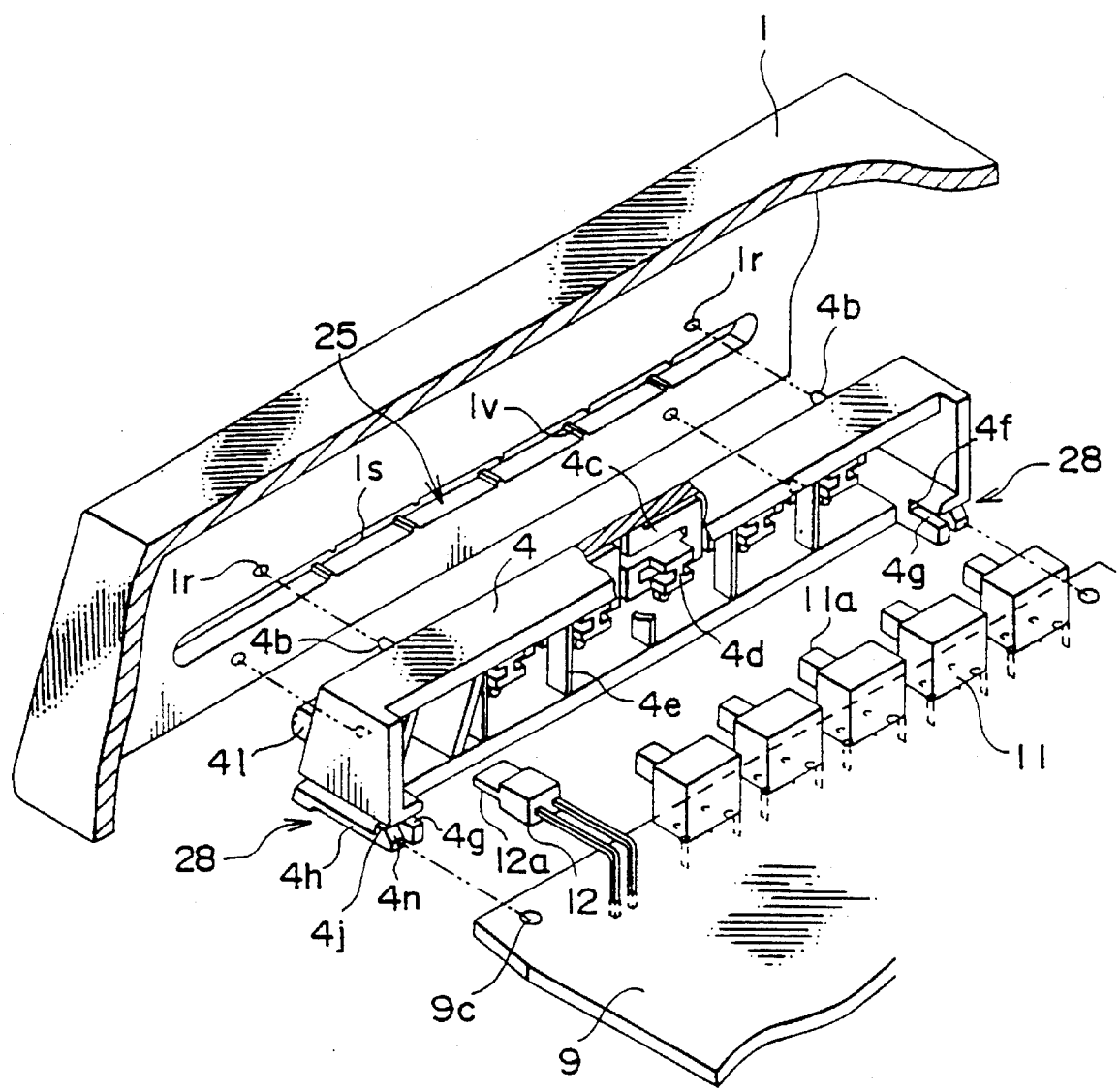
FIG. 15 is an exploded perspective view of the front portion.

As shown in FIG. 7 and FIG. 15, the push button unit installation portion 25 has an oval opening 1s accommodating the push buttons 4a. The oval opening 1s has a plurality of protrusions 1v formed on the upper and the lower face portions at a regular interval and holes 1r formed above and below the oval opening 1s in order to install the push button unit 4.

On the central portion of rear interior of the upper face portion 1A of the upper case 1, there is an engagement portion 26 of the upper case with which an end portion 2k of the rear face portion 2B of the lower case 2 engages. The engagement portion 26 is formed integrally with the upper case 1 and has a slanted face 1x and a groove 1w.

Figure 8:
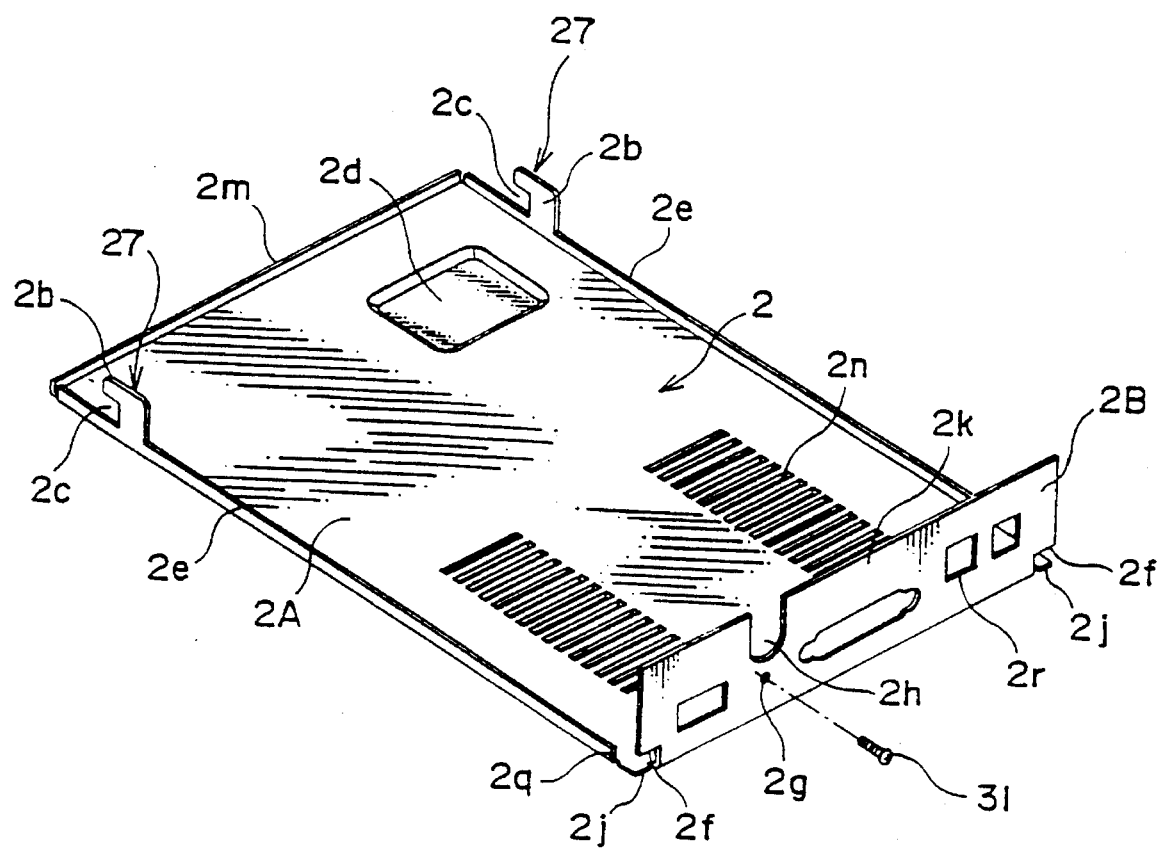
FIG. 8 is a perspective view of the lower case of the appliance.

As shown in FIG. 8, the lower case 2 is integrally made of conductor such as metal plate in order to shield static electricity and noise from entering the electric appliance. The lower case 2 has a bottom portion 2A and rear portion 2B. The bottom portion 2A has a recess 2d for preventing contacting with ROM 14 mounted on the logic package 9 and heat radiating holes 2n.

Also, there are ribs 2e on both sides of the bottom face portion 2A and these ribs 2e engage with the gaps 1g and 1j of the upper case 1. The hook 27 formed on the front portion of the rib 2e is made of L shape protrusion 2b having a notch 2c. Each rib 2e has a flat portion 2j at its rear end and the cut-off portion of the rear end of the rib 2e functions as stopper 2q. The bottom face portion 2A has a rib 2m at its front edge portion.

The rear portion 2B of the lower case 2 has a U shape notch 2h, bis hole 2g, plural openings 2r, and a notch 2f facing the stopper 2q formed at the rear end of the rib 2e and functioning as an engagement hole of the lower case 2.

As shown in FIG. 7, the indication panel 3 has an oval hole 3b accommodating the push button 4a of the push button unit 4 and a transparent portion 3a for the liquid crystal indicator 5. As a result, the indicator 5 can be seen from the outside.

As shown in FIGS. 10, 11, 14, and 15, the push button unit 4 has a rectangular case main body 4A and protrusions 4b positioned at four corners of the front face portion of the case main body 4A so as to engage with the holes 1r of the upper case 1. One side of the front face of the case main body 4A has accommodation portion 41 for accommodating the front end portion 12a of light emission diode (LED) 12 and the accommodation portion 41 has a hole 4m. A plurality of push buttons 4a are arranged in left and right direction on the front side of the case main body 4A. These push buttons 4a are attached to the case main body 4A through resilient connection pieces 4c. A stopper 4k is fixed respectively to the lower side of the push button 4a. Rear face of the push button 4a has a raised portion or stand 4d contacting with a front and 11a of the electric key 11. Pillars 4e are placed in the case main body 4A so as to position at rear of the gaps between the push buttons 4a.

Engagement portions 28 are formed on the left and the right ends of the lower portion of the case main body 4A. These engagement portions 28, respectively have grooves 4g for accommodating front ends of the logic package 9 and a cantilever engagement piece 4h. A front end portion of the engagement piece 4h has a protrusion 4j engageable with the hole 9c of the logic package 9 and the protrusion 4j has a slanted face 4n.

Figure 9:
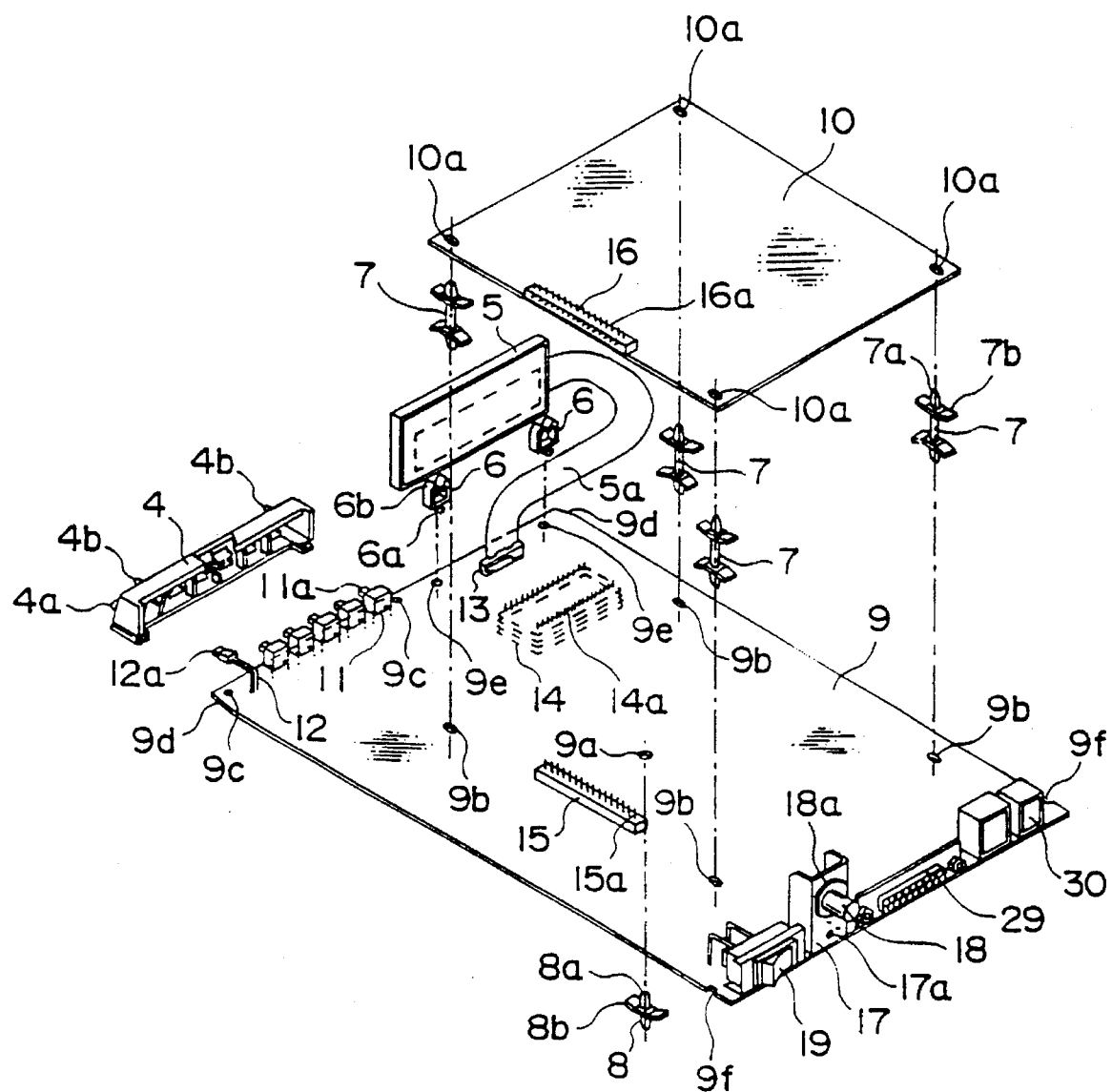
FIG. 9 is a perspective view of the logic package.
Figure 10:
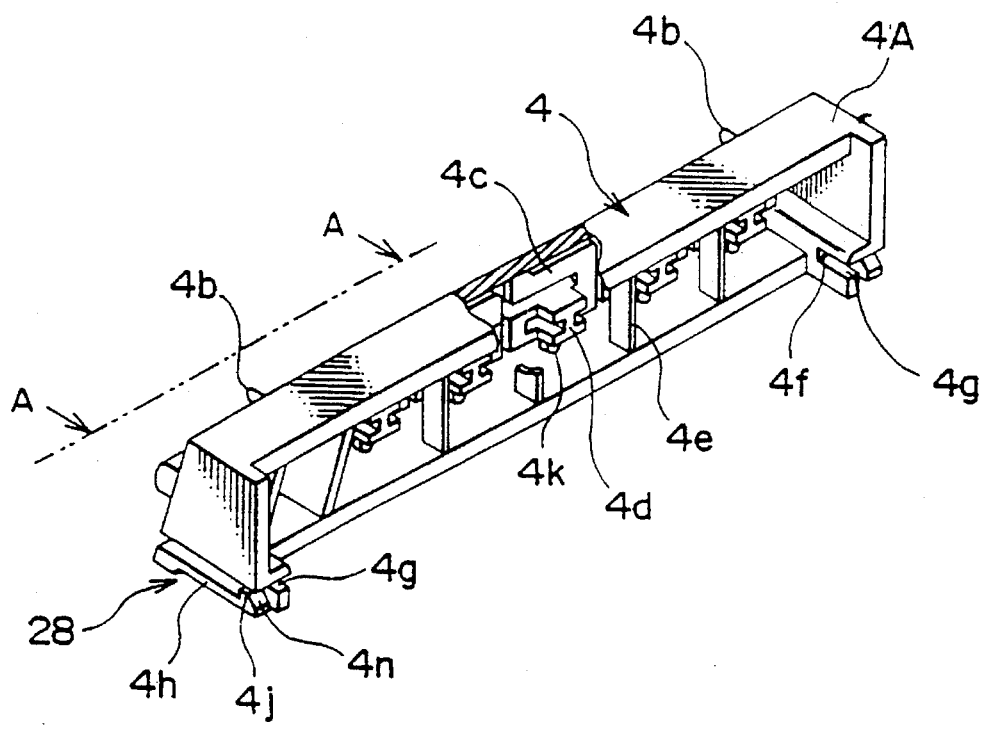
FIG. 10 is a perspective view of the push button unit.

As shown in FIG. 9, the logic package 9 is structured by a print substrate. A connector 15 having part of a terminal 15a connected to an earth is mounted on the logic package 9. A bottom face of the print substrate has a connector 14a and ROM 14 provided on the connector 14a. A face portion of the print substrate has a hole 9a on which a spacer 8 is installed and a hole 9b on which a spacer 7 is installed. A front edge portion of the print substrate has a plurality of electric keys 11, light emission diode (LED) 12 provided with an indicator 12a, a hole 9c engaging with the push button unit 4, a hole 9e on which a holder 6 is installed, and a connector 13 for connecting the liquid crystal indicator (LCD) 5.

A rear edge portion of the print substrate has interface connectors 29, 30, a package holder 17 having a cable holder 18a mounted thereon to secure the power cable 18, and a power switch 19. The package holder 17 has a screw hole 17a formed therein. Front end portions at both sides of the print substrate has a chamfered portion 9d and the rear portion of the print substrate has a notched portion 9f.

The logic package 10 is of a print substrate and upper side portion of the logic package 10 has a connector 16 provided a terminal 16a mounted on part of the connector 16 and connected with an earth. Four corners of the print substrate have four holes 10a and the spacer 7 has a protrusion 7a and a leaf spring 7b. The liquid crystal indicator (LCD) 5 has a connection cable 5a.

Next, assembling steps of the electric appliance structured as mentioned above will be explained.

First an indication panel 3 is attached on a front outside of the upper case 1. The logic packages 9 and 10 are secured by inserting the protrusions 7a, located on the upper end and the lower end of the spacer 7 which is sandwiched between these packages 9 and 10 in order to make a gap between them preventing electronic parts mounted thereon from interfering with each other, into holes 9b and 10a of each logic packages 9 and 10 with the aid of functioning of the leaf spring 7b.

In addition, insertion of the protrusions 7a of the spacer 7 sandwiched between the logic packages 9 and 10 into the holes 9b and 10a makes easy positioning or position determination of the connectors 15 and 16 of respective logic packages 9, 10 while fitting these connectors and results in improved assemblage workability. The protrusion 8a of the spacer 8 is inserted upward through the hole 9a of the logic package 9 and the logic package 9 is secured by function of the leaf spring 8b.

Meanwhile, the front end of the connection cable 5a connected to the liquid crystal indicator (LCD) is secured to a connector 13 mounted on the logic package 9. Protrusions 6a of the holders 6 are inserted into the holes 9e of the logic package.

Figure 14:
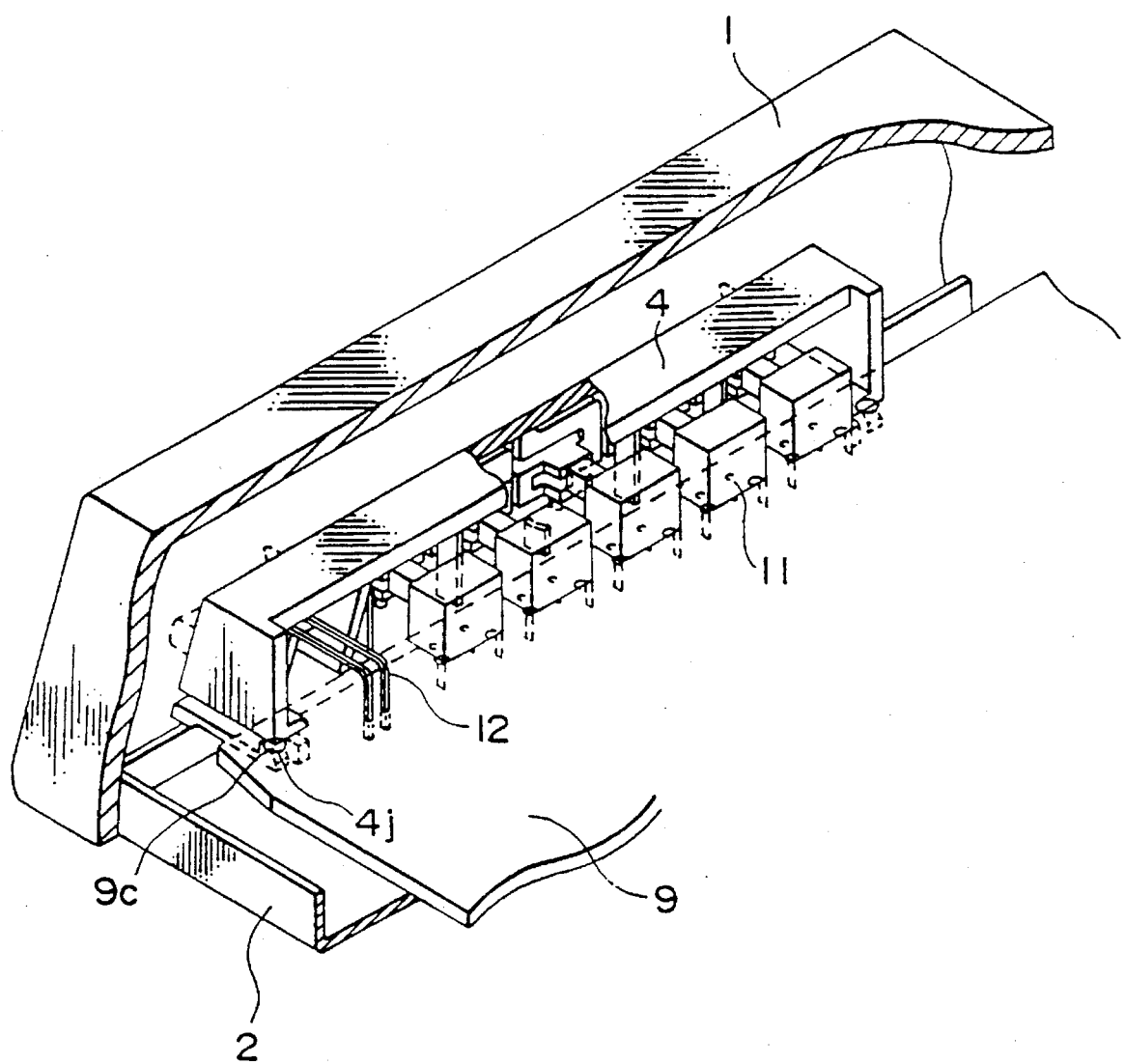
FIG. 14 is a perspective showing a front portion assembled of the electric appliance.

Also, as shown in FIGS. 14 and 15, the push button unit 4 is mounted on the front end of the logic package 9 such that the push button switch is brought together with the electric key 11. That is, the front end of the logic package 9 is inserted into the resilient engagement piece 4h of the push button unit 4 and the bottom face of the case main body 4A, and a protrusion 4j formed on front end of the engagement piece 4h engages with the hole 9c of the logic package 9. As a result, the push button unit 4 is secured to the logic package 9 and front end 11a of the electric key 11 mounted on the logic package 9 contacts the raised portion 4d of the push button 4 to complete the assembly of the push button switch. In addition, the indicator 12a of the light emission diode (LED) mounted on the logic package 9 is accommodated in the hole 4m of the push button unit 4.

Here, it is noted that the slanted face 4n of protrusion 4j of the push button unit 4 makes insertion of the logic package 9 easy and the groove 4g functions as stopper to the insertion movement of the logic package 9. Additionally, the resilient connection piece 4c of the push button unit 4 makes operation of the push button 4c smooth.

Figure 20:
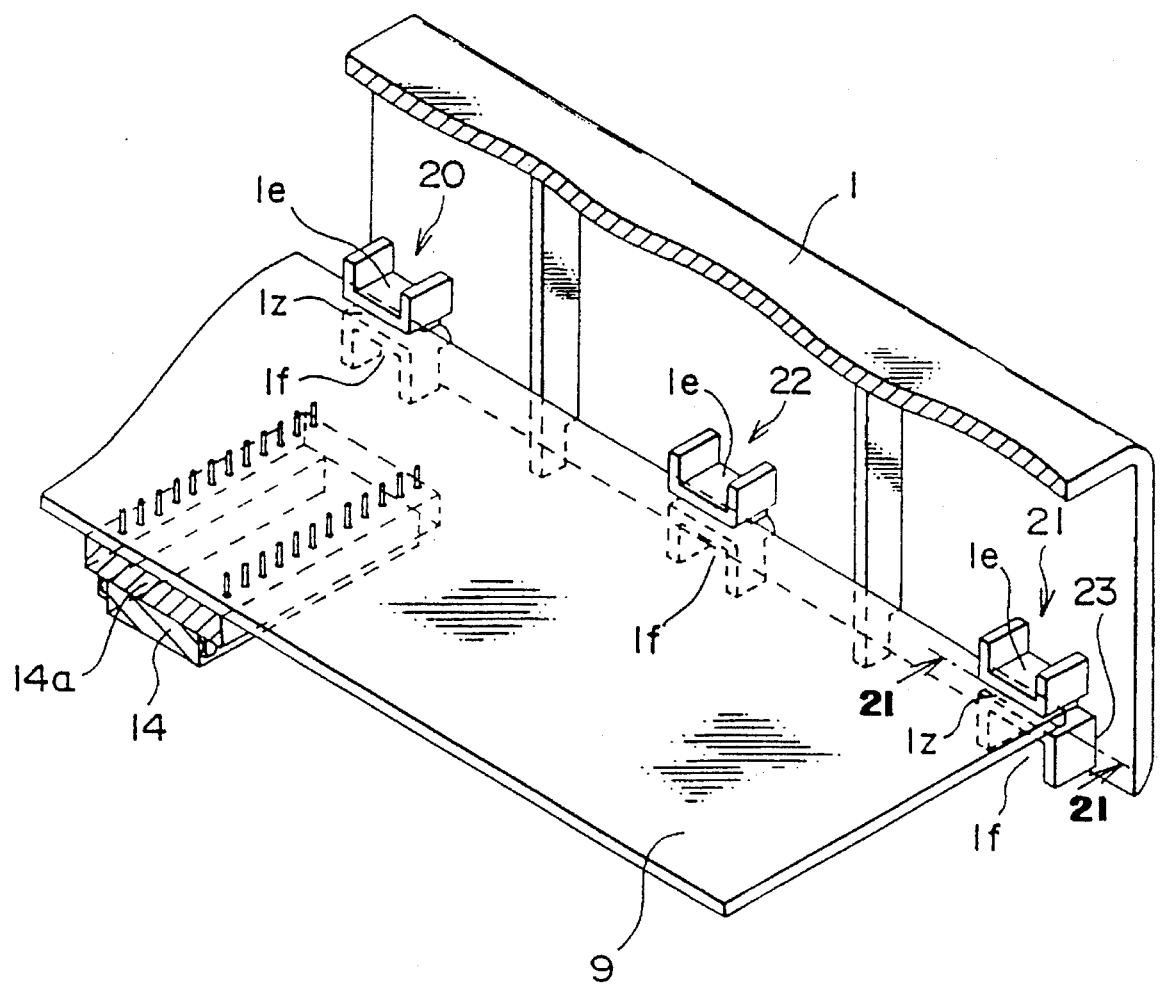
FIG. 20 is a perspective showing installation of the logic package.

Next, as shown in FIGS. 20 and 21, after the push button unit 4, the liquid crystal indicator (LCD) 5, holder 6, the logic package 10 fixed through the spacers 7, and the spacers 8 are mounted on the logic package 9, the left and right side edge portions of the logic package 9 are inserted into the guide groove 1z of the rear side logic packages holding portions 21 placed at the left and right side portions of the upper case 1. As the logic package 9 is inserted forward from the rear of the upper case 1, the left and the right side edge portions of the logic package 9 are sequentially inserted into the guide grooves 1z of the center and the front logic package holding portions 20, 21, 22, and the protrusion 1m of the rear side logic package holding portion 22 engages with the notch 9f formed at the rear portion of the logic package 9 in order to fix the logic package 9 to the upper case 1.

It is noted that the chamfered portion 9d formed on the front portion of the logic package 9 and roundness in of the entrance portion of the guide groove 1z of the logic package holding portions 20, 21, 22 facilitate insertion of the logic package 9.

Figure 18:
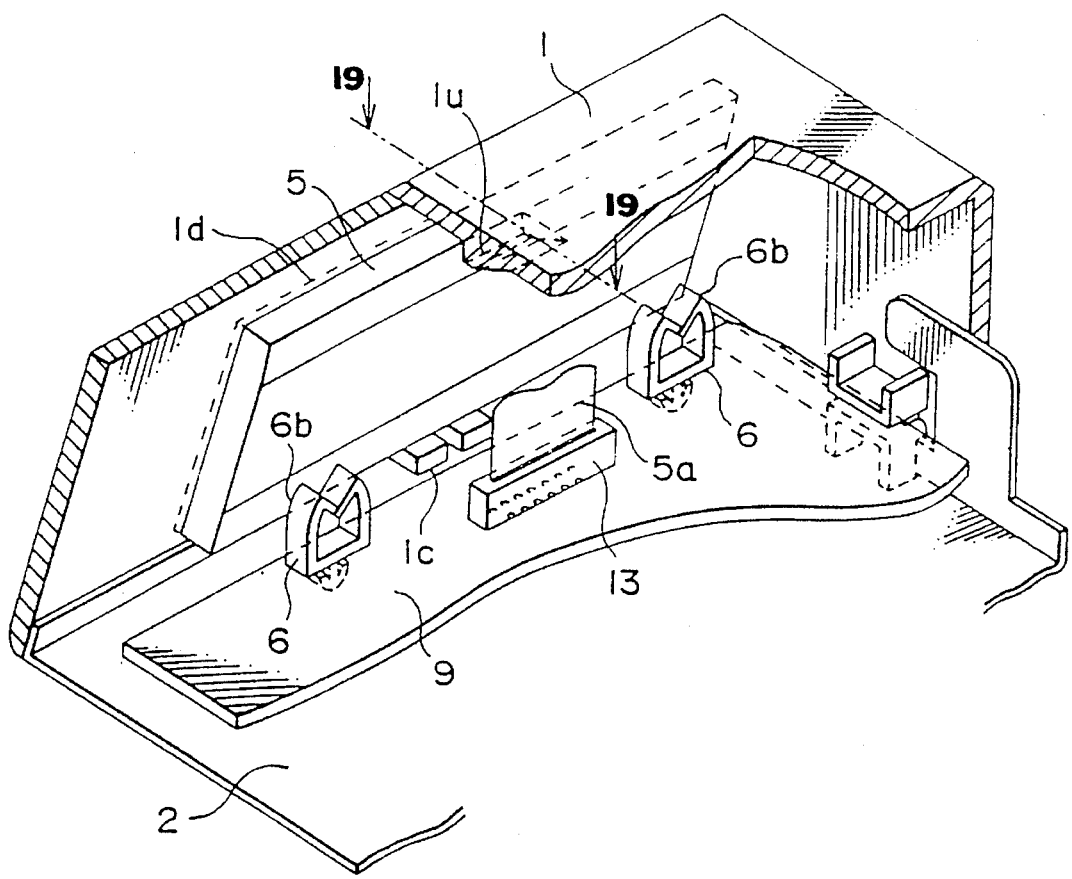
FIG. 18 is a perspective showing a securing condition of liquid crystal indicator.
Figure 19:
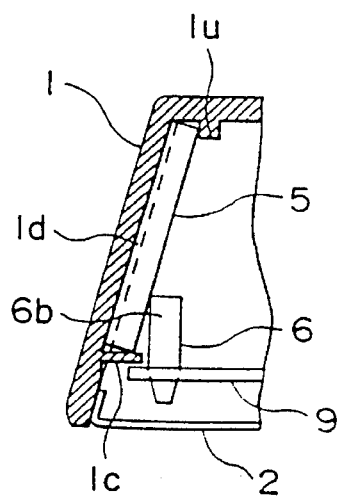
FIG. 19 is a section taken along line 19—19 of shown in FIG. 18.

In addition, as shown in FIGS. 18 and 19, upper portion and both sides of the liquid crystal indicator (LCD) 5 fit in the stepped portion 1d formed at the front portion of the upper case 1. In detail, the upper portion of the LCD 5 engages with the protrusion 1u of the upper case 1 and the lower portion of the LCD 5 is mounted on the protrusion 1c. The holder 6 having its lower portion mounted on the logic package 9 restricts rearward movement of the LCD 5 and the resilient fixing portion 6b of the holder 6 absorbs shock of the LCD 5.

As shown in FIGS. 14 and 15, the push button 4a of the push button unit 4 and the accommodation portion 41 for accommodating the LED 12 are received in the oval hole 1s of the upper case 1, and the protrusion 4b of the push button unit 4 engages with the hole 1r of the upper case 1. As a result, the push button unit 4 is secured to the upper case. It is noted that the protrusion 1r of the upper case 1 prevents the push buttons 4a of the push button unit 4 from mutually contacting with each other.

Figure 11:
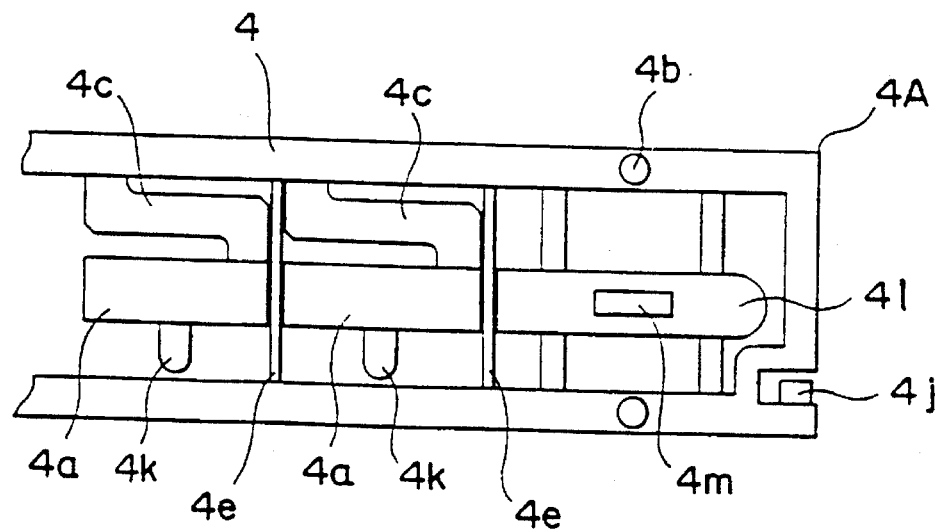
FIG. 11 is a detailed sectional view taken along line 11—11 of FIG. 10.

The pillars 4e of the push button unit 4 prevents the interior of the electric appliance from being seen through a gap or space between the push buttons 4a while the front side of the appliance is seen. Also, as shown in FIGS. 11 and 15, the engagement portions 4k of the push buttons 4a come in contact with the lower edge of the oval hole 1s of the upper case 1 in order to prevent the front ends of the plural push buttons 4a from being uneven.

Next, fixing of the upper case 1 and the lower case 2 will be explained. First, the upper case 1 is turned over making its upper face 1A directed downward. Then the L shape protrusion 2b of the lower case 2 is inserted under the front logic package holding portion 20 of the upper case 1 and secured there. The lower case 2 turns toward the upper case 1 around a fulcrum of the front logic package holding portion 20 so as to overlap the lower case 2 upon the upper case 1, such that the left and right ribs 2e of the lower case 2 engage with the gaps 1g and 1j of the upper case 1.

Figure 13:
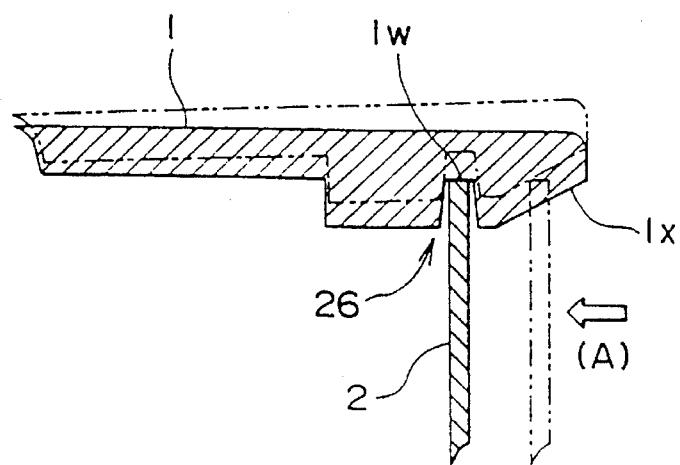
FIG. 13 is a section taken along line 13—13 of FIG. 12.

Next, the lower case 2 is pushed frontward, and end portion 2k of the rear face 2B of the lower case 2 slides along the slanted face 1x of the engagement portion 26 near the rear and center portion of the upper case 1 in order to make the end portion 2k engaged with the groove 1w (see FIG. 13). Then, the lower case 2 is pushed upwardly along an arrow A direction as shown by broken lines in FIGS. 16 and 17. The lower case then slides in an arrow B direction such that an engagement portion 23 at a rear end of the lower shape protrusions 1f of the upper case 1 is inserted between the flat portion 2j and the notch 2f of the lower case 2.

When the upper case 1 and the lower case 2 are secured vertically, the logic package holding portion 20 and L shape protrusion 2b are engaged with each other at the front portion of the cases and the engagement portion 23 engages with the rear notch 2f. When the upper case 1 and the lower case 2 are horizontally secured, an engagement at the rear center portion of the cases, or an engagement of the end portion 2k of the rear face portion 2B of the lower case 2 and the engagement portion 26 of the upper case 1 is effectuated.

Figure 12:
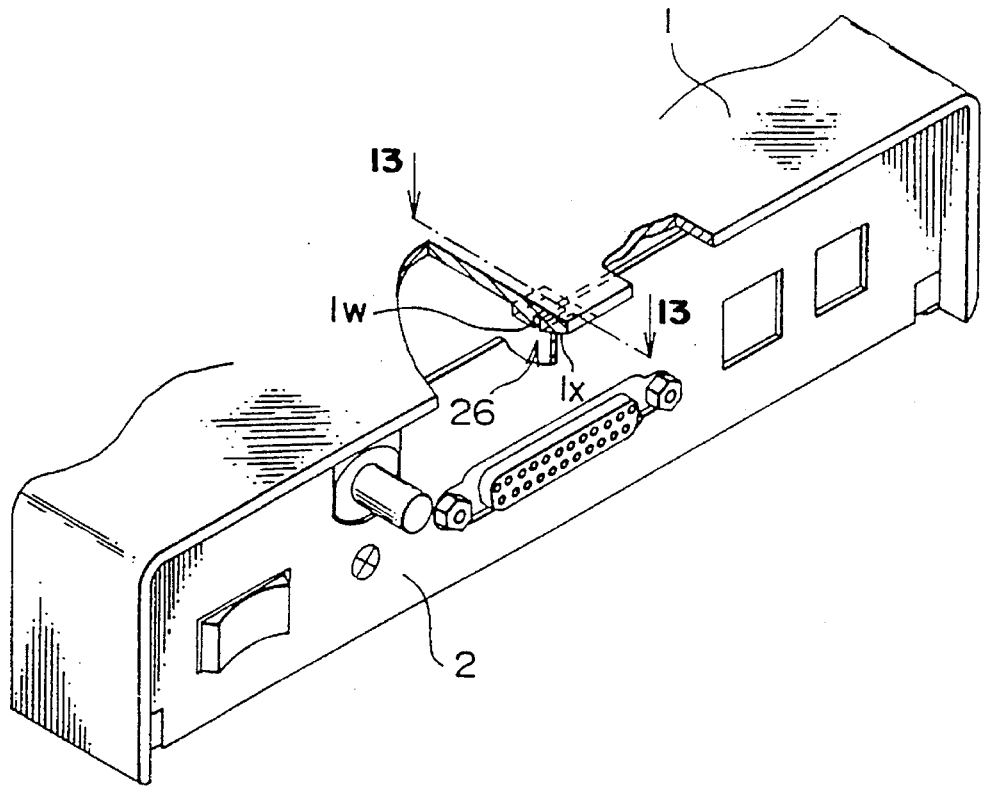
FIG. 12 is a perspective depicting rear portion engagement condition of the electric appliance.

It is noted that, as shown in FIGS. 12 and 13, the slanted face 1x of the upper case 1 makes insertion of the end portion 2k of the lower case 2 easy and the engagement of the groove 1w of the upper case 1 with the end portion 2k of the lower case 2 is further facilitated as the groove 1w of the upper case 1 deforms as shown by dotted lines.

As described above and shown in FIG. 16 and FIG. 17, the lower case 2 moves upwardly in the direction A to its installation position on the upper case 1 and slides in the direction B, so that the engagement portion 23 of the rear end portion of the rear lower shape protrusion 1f of the upper case 1 engages with notch 2f and flat portion 2j of the lower case 2. In order to disengage or disassemble the lower case 2 from the upper case 1, the lower case 2 slides along the arrow C direction and the lower case 2 stops when the end portion 21 of the rib 2e of the lower case 2 contacts with an inside of the rib 1q of the shape protrusion 1f of the upper case 1. As a result, it is possible to prevent the lower case 2 and ROM 14 mounted on the connector 14a on the bottom face of the logic package 9 from contacting to each other while the lower case 2 in installed and disassembled.

In addition, the spacer 8 mounted on the bottom face of the logic package 9 prevents the lower case 2 from contacting the logic package 9 when the electric appliance is upwardly pushed.

Lastly, the whole assemblage of the electric appliance is completed by inserting a bis 31 through the hole 2g of the lower case 2 and threading it into the screw hole 17a of the package holder 17 of the logic package 9.

FIG. 1 to FIG. 5 show the electric appliance as assembled. In addition, the bis 31 intends to electrically conduct the lower case 2 to the earth of the logic package 9 through the package holder 17 but the bis 31 is not so important to the assemblage of the housing of the electric appliance according to the present invention. Using the bis 31 makes the upper and the lower cases 1 and 2 and the logic package 9 strongly binded.

Because ROM 14 is mounted on the connector 14a and on the bottom face of the logic package 9, it is easy to exchange ROM 14 only by disassembling the lower case 2.

Figure 1:
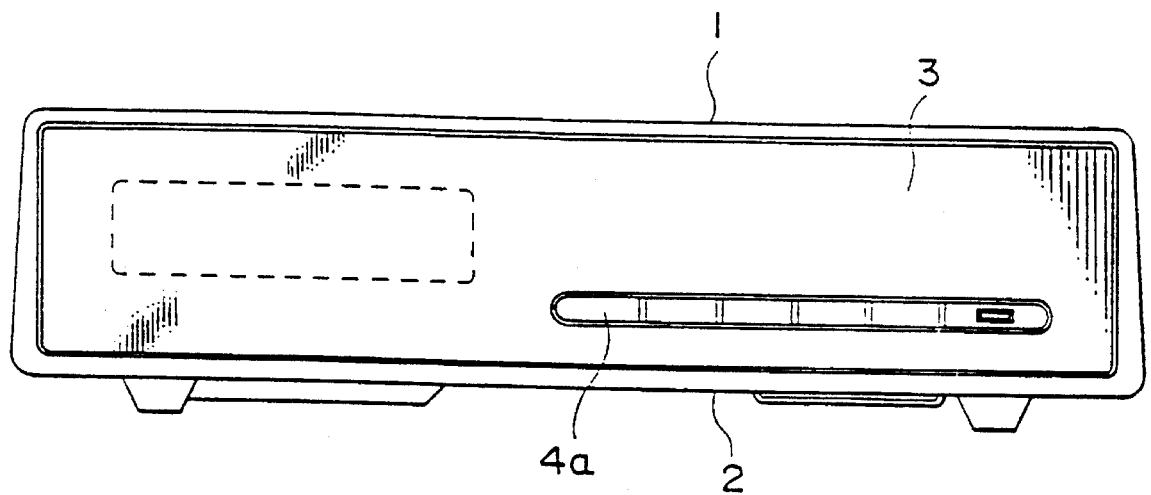
FIG. 1 is a front view of the electric appliance concerning an embodiment of the present invention.
Figure 2:
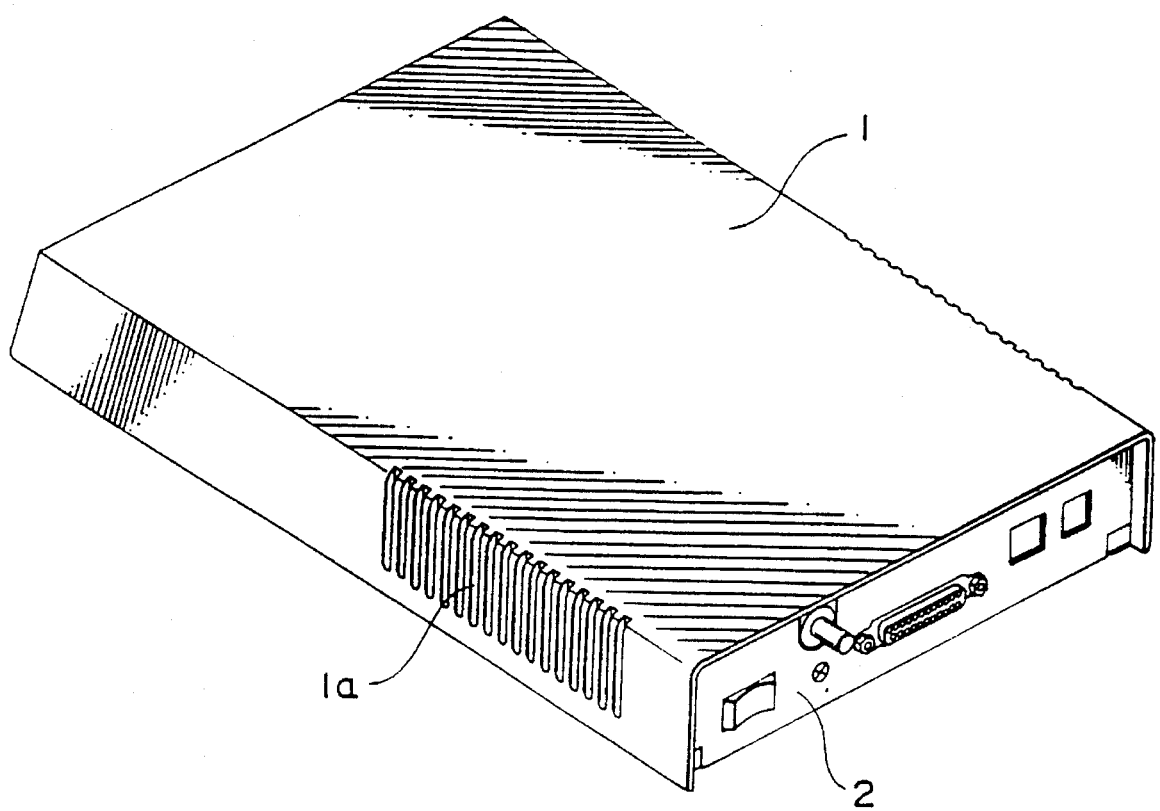
FIG. 2 is a perspective view of the embodiment above.
Figure 3:
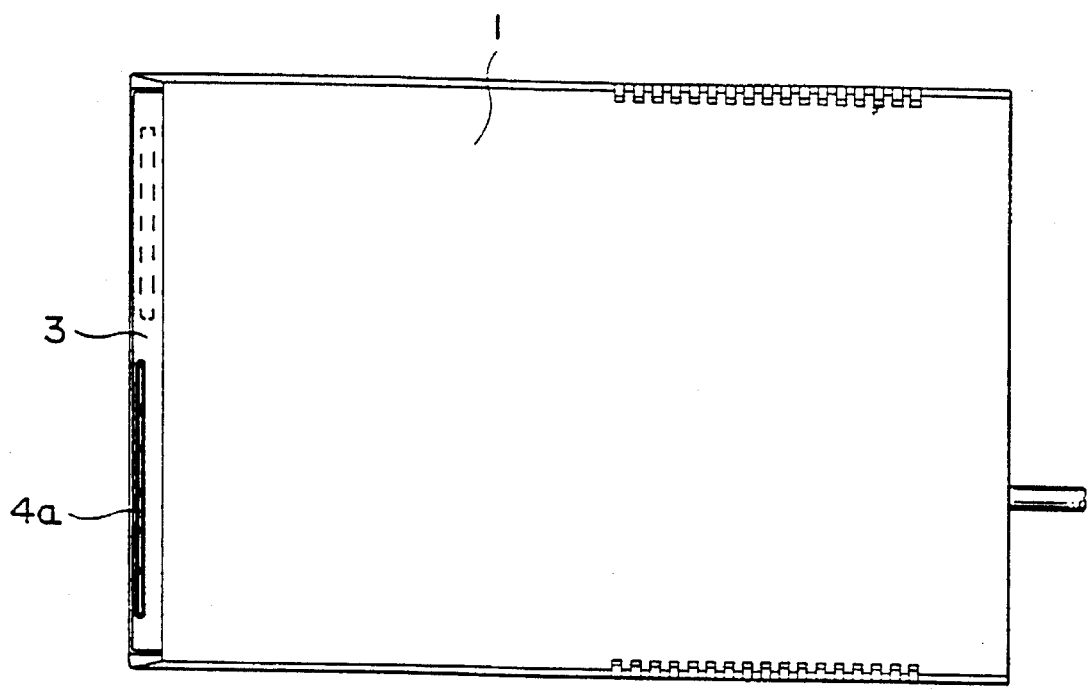
FIG. 3 is a plane view of the electric appliance.
Figure 4:
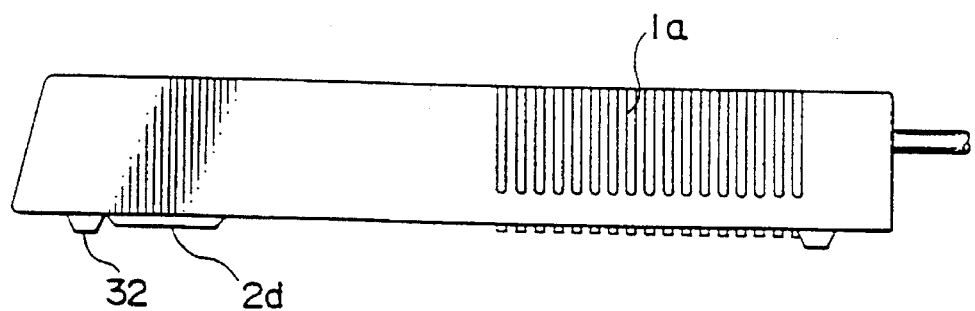
FIG. 4 is a right side elevation of the electric appliance.
Figure 5:
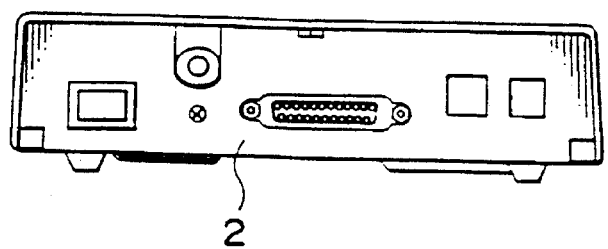
FIG. 5 is a rear view of the electric appliance.

In addition, the purpose of the recess 2d of the lower case 2 is to lessen the height of the electric appliance of the present invention by placing the bottom face of the lower case 2 on a rubber seat 32 (see FIG. 4).

Figure 22:
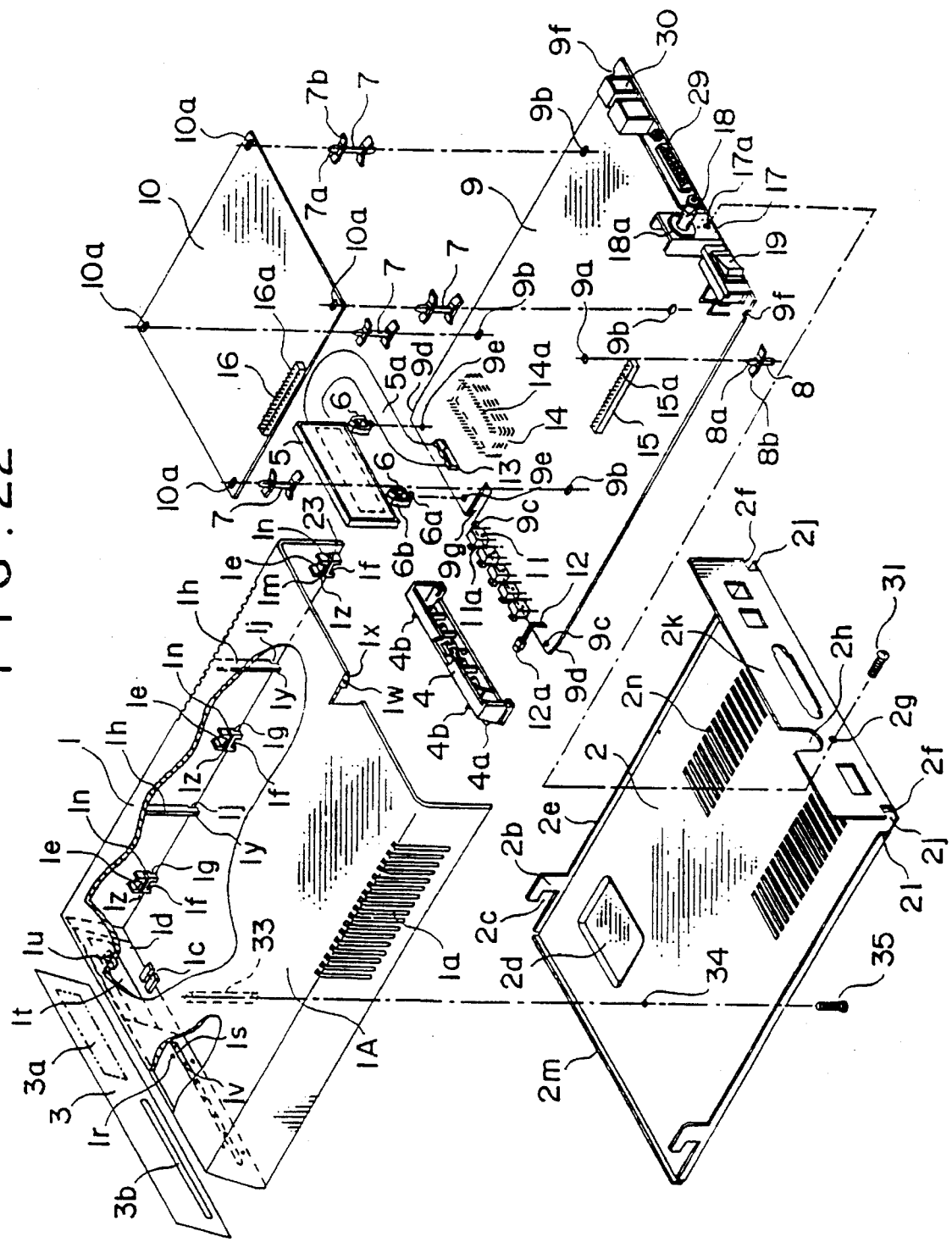
FIG. 22 is an exploded perspective of the electric appliance of another embodiment according to the present invention.

FIG. 22 shows another embodiment of the electric appliance according to the present invention. According to this embodiment, a screw seat 33 is provided on an inner face portion of the upper face portion 1A of the upper case 1 and a screw hole 34 is formed on the lower case 2. The upper and lower cases 1 and 2 are assembled as described with the first embodiment, and in addition a screw 35 is threaded into the screw seat 33 through the screw hole 34 in order to make the fixing of the lower case 2 and upper case 1 more secure.

Now, a housing structure of the electric appliance, wherein a fixture of the upper and the lower cases in the electric appliance in the above-mentioned embodiments is further improved and disassembly work of these upper and lower cases is facilitated, will be discussed hereafter.

Figure 23:
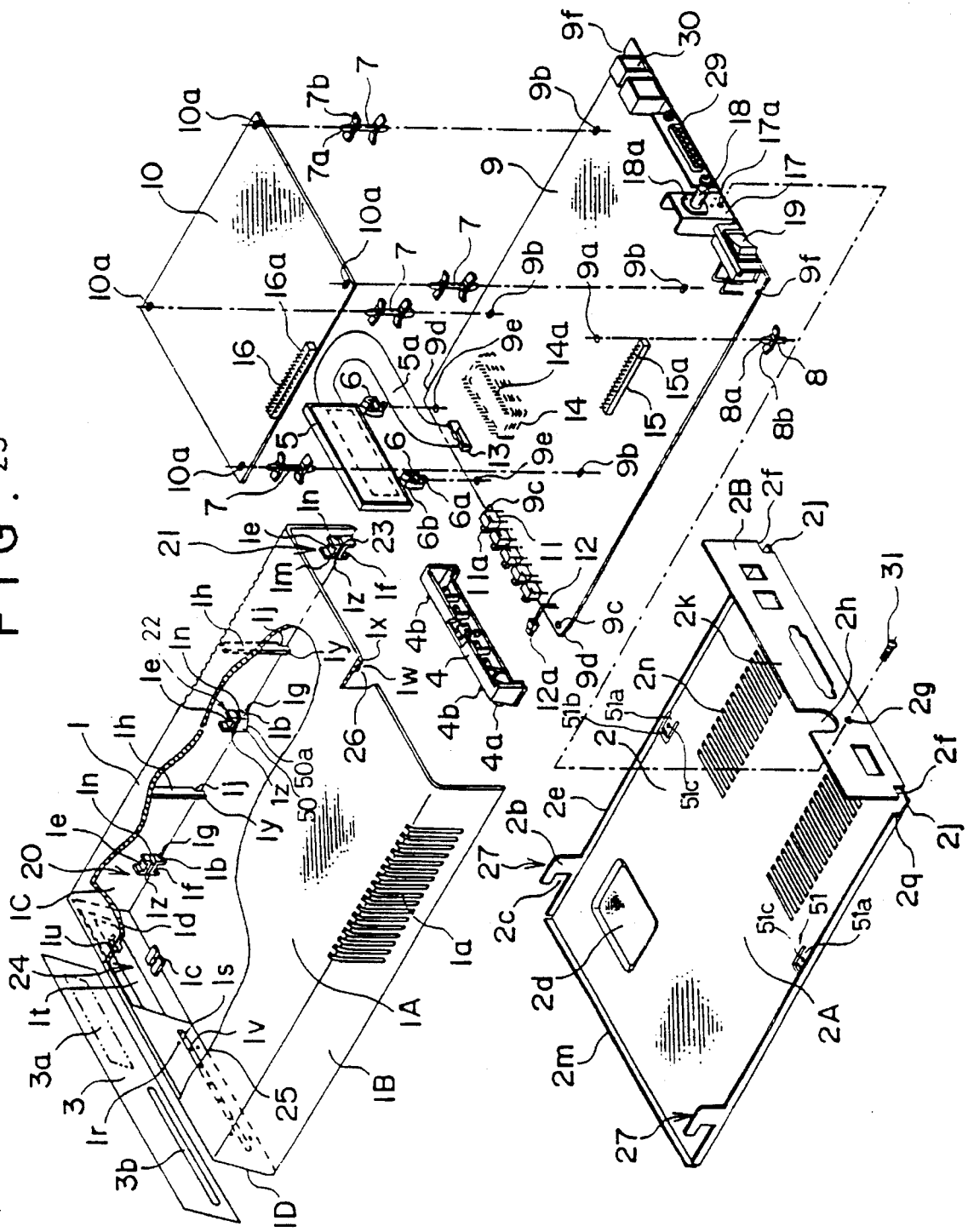
FIG. 23 is an exploded perspective view of the electric appliance relating to another embodiment of present invention.
Figure 24:
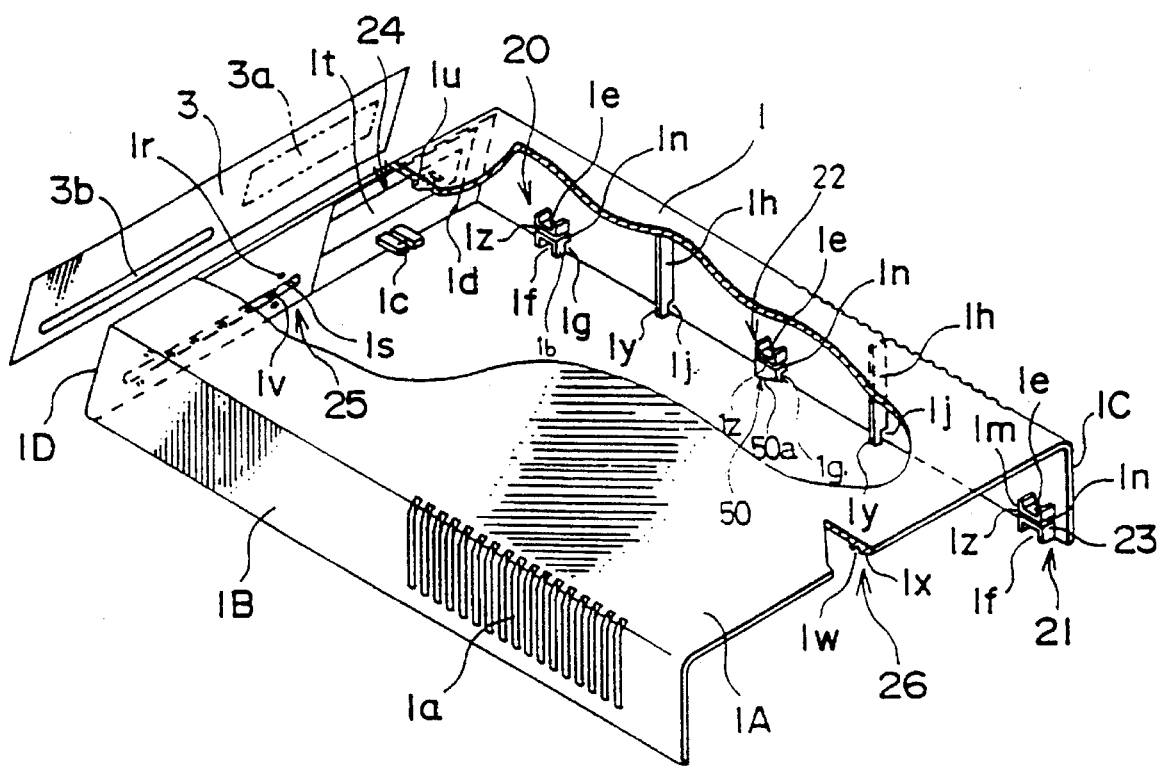
FIG. 24 is a perspective view of the upper case.
Figure 25:
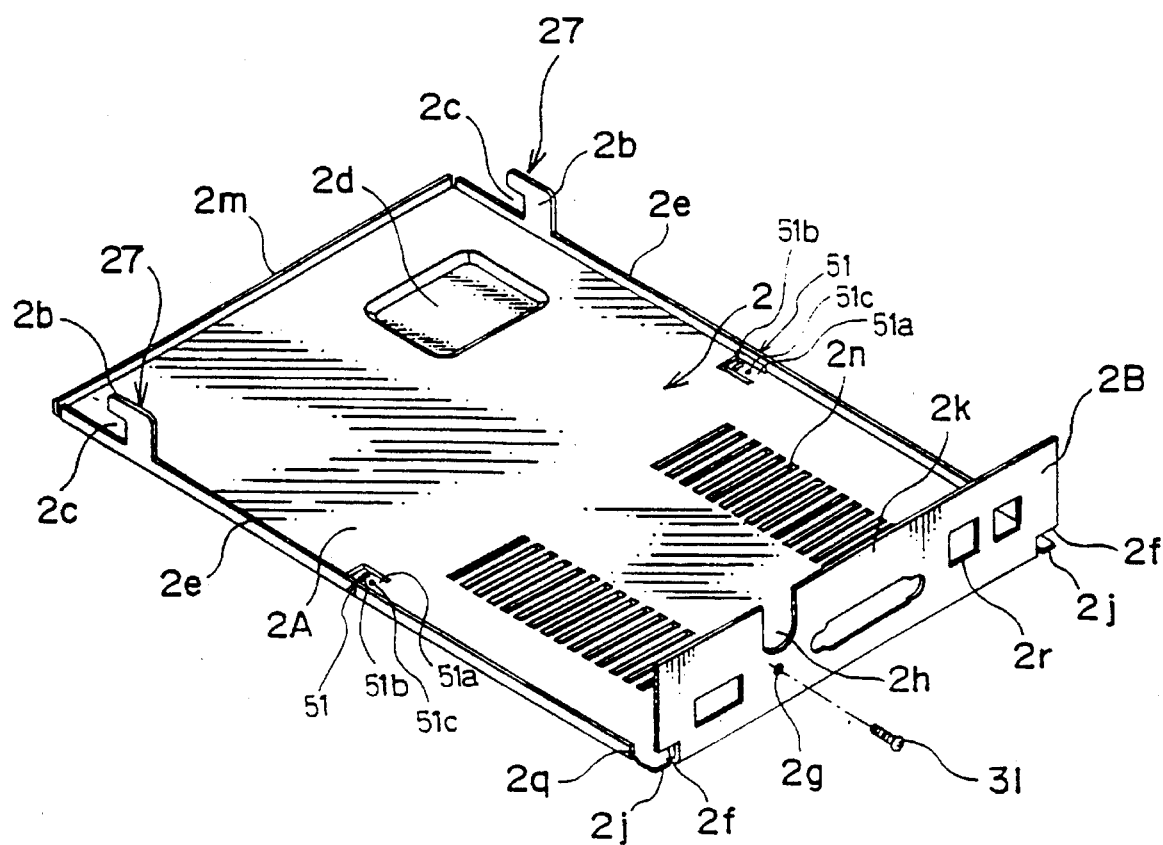
FIG. 25 is a perspective view of the lower case.
Figure 26:
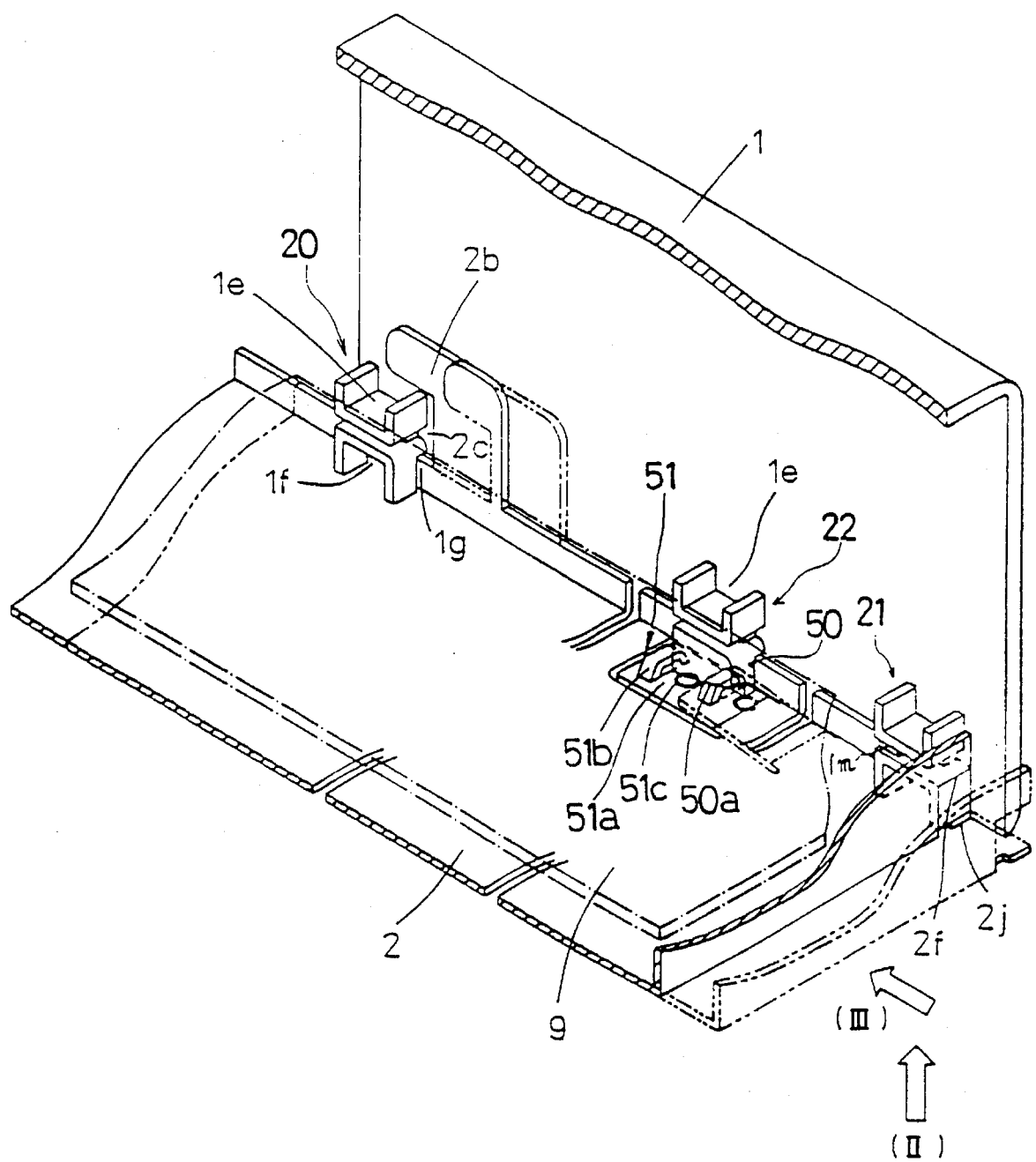
FIG. 26 is a perspective view showing an engagement condition of the upper and lower cases.
Figure 27:
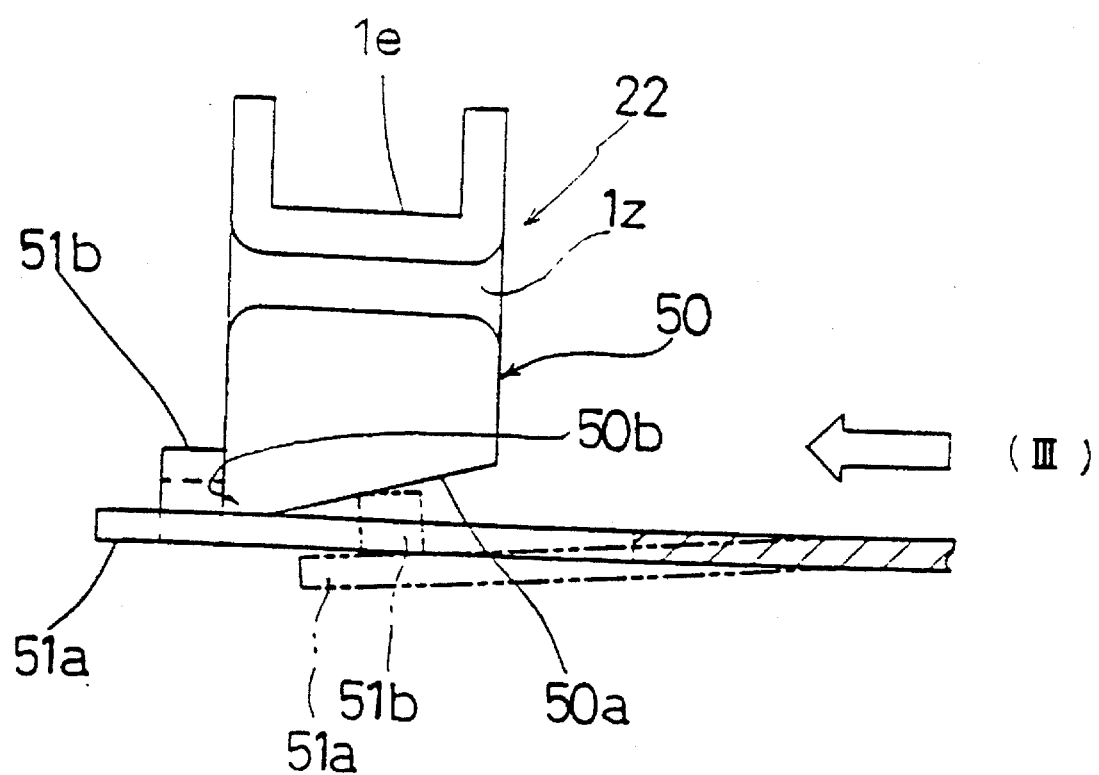
FIG. 27 is a detail view of an engagement condition of the portion having the protrusion engagement portion.
Figure 28:
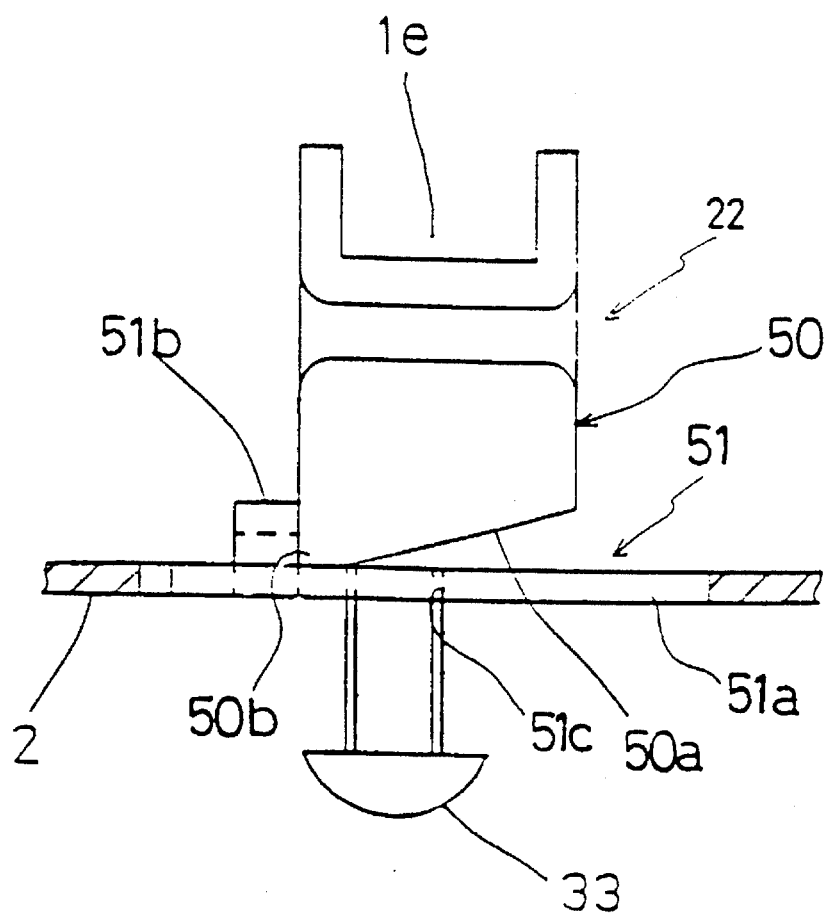
FIG. 28 is a detail view of an assembled condition of the portion having the protrusion engagement portion.
Figure 29:
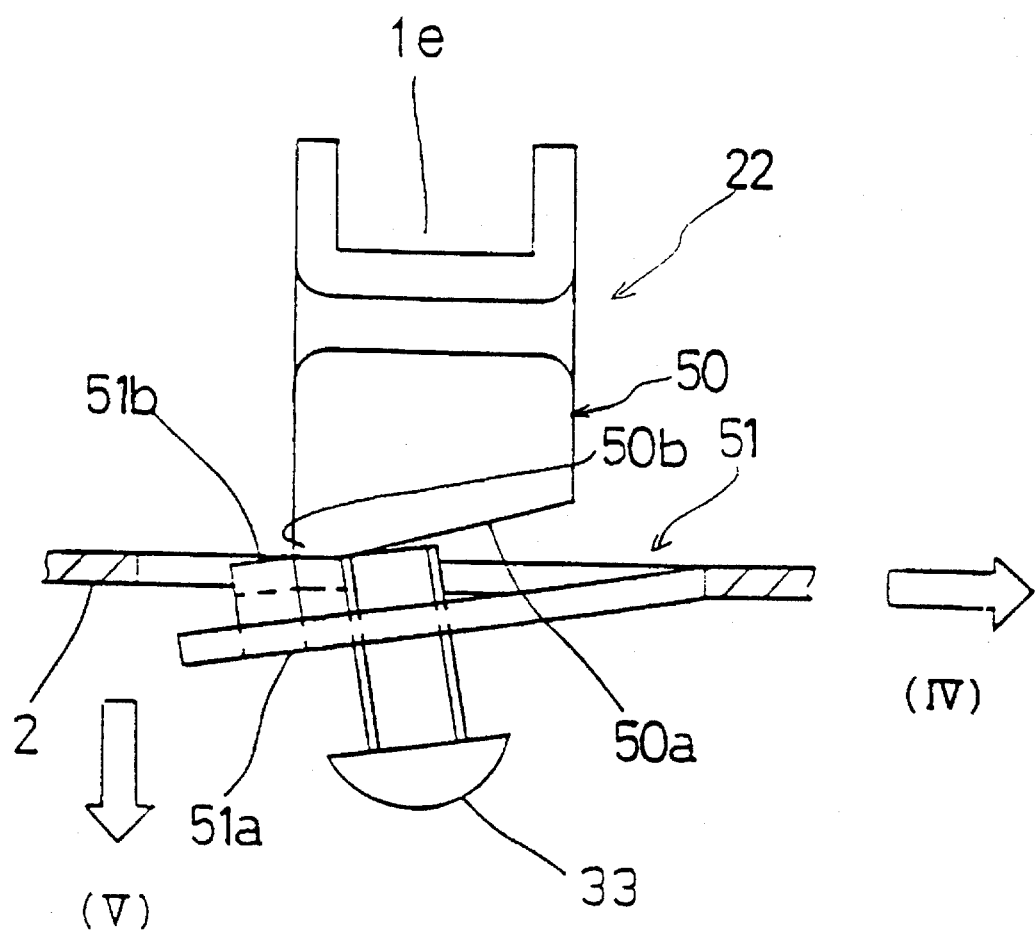
FIG. 29 is a detail view of a dismounting condition of the portion having the protrusion engagement portion.
Figure 30:
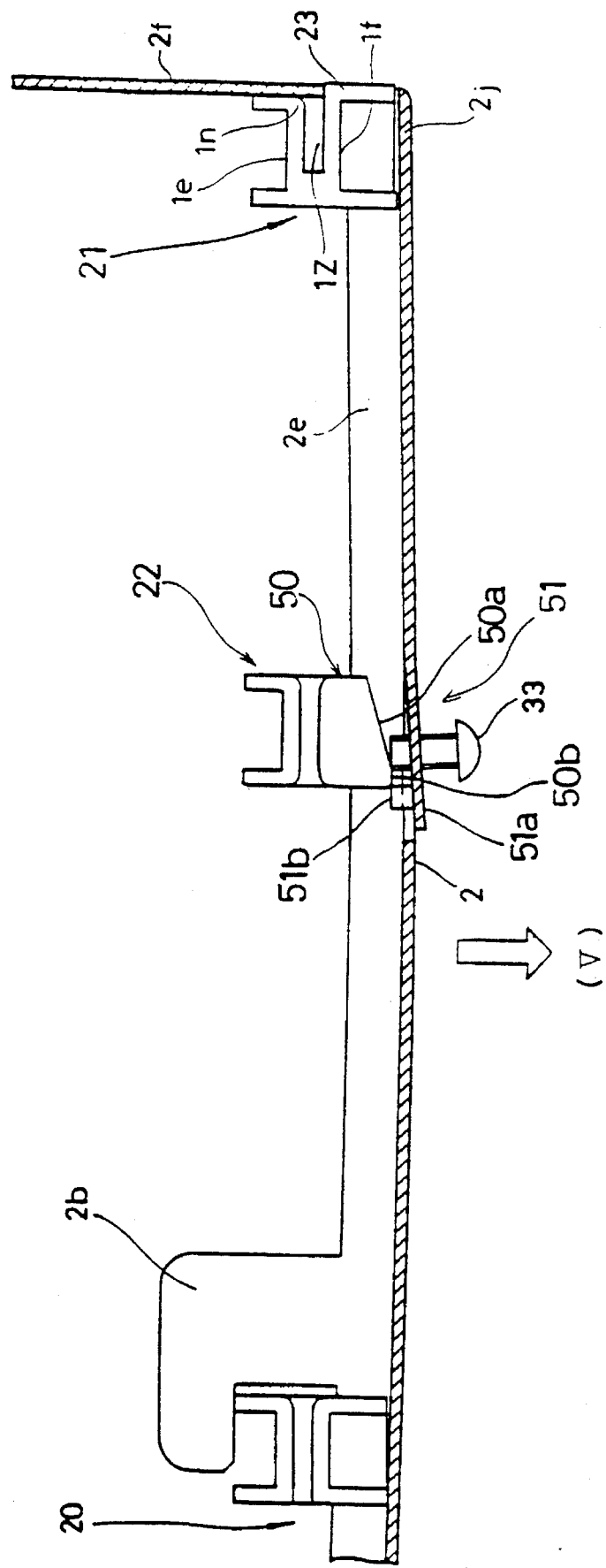
FIG. 30 is a cross section of the upper and lower cases showing the start of a dismounting condition.
Figure 31:
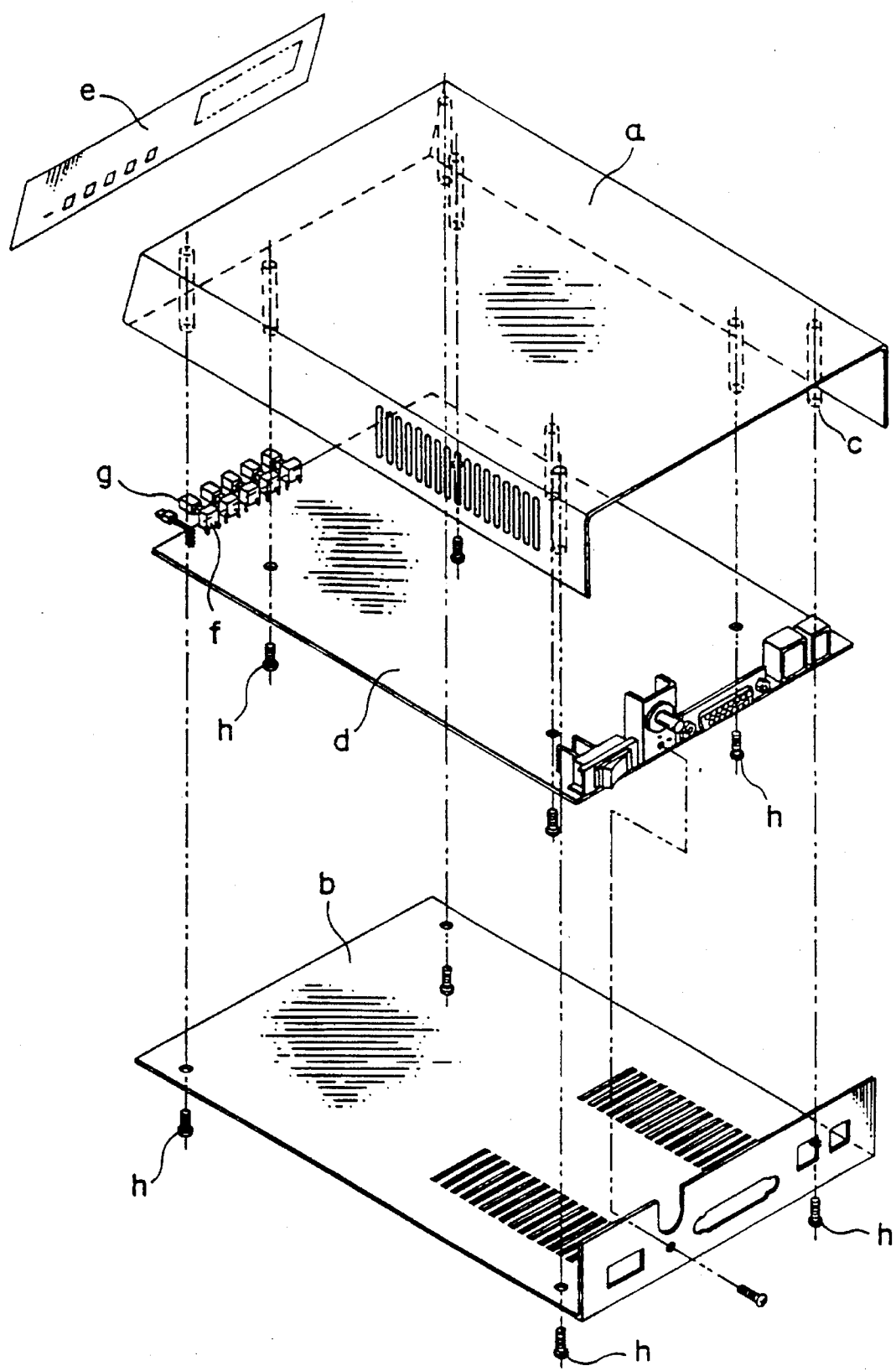
FIG. 31 is an exploded perspective view of the housing structure of the conventional electric appliance.

FIG. 23 is an exploded perspective view of the electric appliance relating to another embodiment of present invention; FIG. 24 is a perspective view of the upper case; FIG. 25 is a perspective view of the lower case; FIG. 26 is a perspective view showing an engagement condition of the upper and lower cases; FIG. 27 is a detail view of an engagement condition of the portion having the protrusion engagement portion; FIG. 28 is a detail view of an assembled condition of the portion having the protrusion engagement portion; FIG. 29 is a detail view of a dismounting condition of the portion having the protrusion engagement portion; and FIG. 30 is a cross section of the three logic holding portions showing the start of a dismounting condition.

As shown in FIG. 23, the differences between the electric appliance of this embodiment and the electric appliance of the previously described embodiments are the provision of an engagement portion 50 at the middle logic package holding portion 22 which is the middle one of the logic package holding portions 20, 21, 22 arranged on inner sides of the left and right side face portions 1B, 1C of the upper case 1 and a provision for an engaging portion 51 at the left and the right sides near the center of the bottom face portion 2A of the lower case 2.

First, the logic package holding portion 22 is provided with the guide groove 1z between the shape protrusion 1e and the engagement portion 50, as shown in FIG. 24 and the insertion groove 1g between the engagement portion 50 and the left side face portion 1B (or the right side face portion 1C) on inner faces of the upper case 1. The engagement portion 50, as shown in FIG. 27, comprises a slant face 50a formed on an end face of the logic package holding portion 22 so as to be rearwardly slanted and a protrusion engagement portion 50b formed with the slant face 50a and the front face of the logic package holding portion 22.

An engaging portion 51 is provided on the bottom face portion 2A of the lower case 2 is engaged with the engagement portion 50 of the upper case 1. As shown in FIG. 25, the engaging portion 51 has a resilient half portion 51a in a half support which is formed to be cut out on the bottom face portion 2A and the resilient half portion 51a is provided with an extrusion portion 51b at the front end portion on the inner face of the resilient half portion 51a and a threaded hole 51c at the rear portion on the inner face of the resilient half portion 51a. The resilient half portion 51a is bent to the inside of the lower case 2, i.e, slightly inwardly.

Next, the fixture of the upper case 1 and the lower case 2 will be discussed.

First, as described in the above-embodiment, after installing the push button unit 4, the liquid crystal indicators (LCD) 5 and the logic package 9, while the upper case 1 is turned over to direct its upper face 1A downward, the L-shape protrusion 2b of the lower case 2 is inserted under the front logic package holding portion 20 of the upper case 1 and secured there, and the lower case 2 turns toward the upper case 1 around a fulcrum of the front logic package holding portion 20 so as to overlap the lower case 2 on the upper case 1, and the left and the right ribs 2e of the lower case 2 engage with the gaps (insertion grooves) 1g and 1j of the upper case 1.

Then, the lower case 2 is pushed frontward, and the extrusion portion 51b of the engaging portion 51 at both sides near the center of the lower case 2, as shown in FIG. 26, slides along the slant face 50a of the engagement portion 50 of the upper case 1, so that the extrusion portion 51b is engaged with the protrusion engagement portion 50b of the engagement portion 50. Furthermore, the end portion 2k of the rear face portion 2B of the lower case 2 slides along the slanted face 1x of the engagement portion 26 near the rear and center portion of the upper case 1, so that the end portion 2k is engaged with the groove 1w of the engagement portion 26. Additionally, as shown in FIG. 17, an engagement portion 23 at a rear and lower shape protrusions 1f of the upper case 1 is engaged with the notch 2f of the lower case 2.

Consequently, when the upper case 1 and the lower case 2 are vertically secured, the fixture at the front and the rear portions of the cases is carried out by engaging the logic package holding portion 20 with the L-shape protrusion 2b and engaging the engagement portion 23 with the notch 2f. When the upper case 1 and the lower case 2 are horizontally secured, the fixture at the rear center portion of the cases is carried out by the engaging the protrusion engagement portion 50b of the engagement portion 50 with the extrusion portion 51b of the engaging portion 51 and engaging the end portion 2k of the rear face portion 2B with the groove 1w of the engagement portion 26.

As described above and shown in FIGS. 26 and 27, the lower case 2 moves upwardly in the direction II to its installation portion of the upper case 1 and slides in the direction of III, so that the extrusion portion 51b of the lower case 2 is engaged with the protrusion engagement portion 50b of the engagement portion 50 near the center of the upper case 1.

In the above explanation, since the logic package holding portion 20, 21, 22 function as the guiding and holding portions of the upper case 1 for package 9 and as the engaging portions with the lower case 2, the shape of the lower case 2 is much simplified. Thus, a mold for shaping the lower case 2 having these functions can be easily formed.

However, as these functions need not coexist to be operable, the logic package holding portions 20, 21, 22 and the first upper case side engagement portion can be separately provided in other embodiments. Namely, these logic package holding portions 20, 21, 22 can be formed, as logic package holding portions only for holding the logic package 9, slightly above the lower case 1 at the inner side of the left and right side faces 1B, 1C of the upper case 1, in which case, the shape of each logic package holding portion would be similar to the logic package holding portions 20, 21, 22.

Next, the dismounting method of the lower case 2 from the upper case 1 will be discussed, as shown in FIGS. 28 and 29, hereafter.

First, a screw 33 is inserted and screwed into the threaded hole 51c of the resilient half portion 51a of the engaging portion 51 at both sides near the center of the lower case 2. Using the screw 33, the engaging portion 51 of the lower case 2 can be moved in the direction V and the lower case 2 can be pulled out in the direction IV when the tip end of the extrusion portion 51b of the lower case 2 is positioned lower than the lowest part of the engagement portion 50 of the upper case 1. Consequently, the lower case 2 is dismounted from the upper case 1.

Additionally, an inward bent of the engaging portion 51 of the lower case 2 has a role to assure engagement of the engagement portion 50 of the upper case 1 with the engaging portion 51 of the lower case 2. Furthermore, the slant face 50a of the upper case 1 functions to smooth the engaging work of the extrusion portion 51b of the lower case 2 and the dismounting work of the lower case 2.

As shown in FIG. 30, the lower case 2 has supporting structure at both ends to be vertically fixed to the upper case 1, by engaging the front logic package holding portion 20 with the L-shape protrusion 2b and engaging the notch 2f with the engagement portion 23. When the engaging portion 51 of the lower case 2 moves downwardly, a center of the lower case 2 moves downwardly, the lower case 2 slightly curves outwardly, so that a screwing force to screw the screw 33 and a transformation of the engaging portion 51 are small. This eases workability when the lower case 2 is dismounted from the upper case 1.

Additionally, though the housing structure of the electric appliance which accommodates the logic package 9 in the upper and lower cases 1 and 2 is discussed in the above embodiments, the present invention can apply to a housing structure of an appliance which does not accommodate the logic package 9.

Hence, according to the housing structure of an electric appliance of the present invention, the electric appliance comprises the upper case 1 provided with the logic package holding portion 20, 21, 22 arranged on inner sides of the left and right side face portions 1B and 1C of the upper case 1 in front and rear directions at a regular interval, the first upper case side engagement portion (e.g., the engagement portion 50), formed on at least the middle logic package holding portion 22 of the holding portions 20, 21, 22, and the second upper case side engagement portion (e.g., the engagement portion 26), and a lower case 2 provided with the first lower case side engagement portion (e.g., the engaging portion 51) to engage releasibly with the engagement portion 50, the engagement being released by means of turning a screw 33, and the second lower case side engagement portion (e.g., the end portion 2k) to engage releasibly with the engagement portion 26 and hooks 27, formed at the front portions of the left and the right sides of the lower case 2, which are adapted to hook the frontmost logic package holding portion 20 in order to position the lower case 2 to overlap with the upper case 1 such that pushing the lower case 2 forward against the upper case 1 results in an engagement of the engagement portion 50 with the engaging portion 51 and the engagement portion 26 with the end portion 2k. Therefore, the housing structure of the electric appliance improves the assembling workability and fixes rigidly the upper case 1 to the lower case 2, since the housing does not use the screw 33 for assembling the housing.

Additionally, the engagement portion 50 of the upper case 1 has the slant face 50a formed on the end face of the middle logic package holding portion 22, the end face thereof slanting rearwardly and forming the protrusion engagement portion 50b with the front face of the middle logic package holding portion 22, and the engaging portion 51 of the lower case 2 has the resilient half portion 51a in a half support which is formed on the bottom face portion 2A of the lower case 2 and on which the extrusion portion 50b that engages releasibly with the protrusion engagement portion 51b and the threaded hole 51c for the screw 33 are formed. Therefore, since the housing structure of the electric appliance is disassembled by inserting the screw 33 into the threaded hole 51c, turning the screw 33 into the threaded hole 51c so that the end portion of the screw 33 contacts slidably onto the slant face 50a so as to move the resilient half portion 51a downwardly away from the upper case 1, to release the engagement of the extrusion portion 50b from the protrusion engagement portion 51b so that it is possible to move rearwardly the lower case 2 in relation to the upper case 1, and pulling out the lower case 2 from the upper case 1 resulting in dismounting of the lower case 2 from the upper case 1, the assembling and the disassembling workability are improved.

According to the disassembly method of the housing structure of the electric appliance of the present invention, the electric appliance has the upper case 1 provided with the logic package holding portions 20, 21, 22 arranged on inner sides of the left and right side face portions 1B and 1C of the upper case 1 in front and rear directions at a regular interval and the engagement portion 50, formed on at least the middle logic package holding portion 22 of the holding portions 20, 21, 22, which has a rearwardly slanted face 50a formed on the end face of the middle logic package holding portion 22 forming the protrusion engagement portion 50b with the front face of the middle logic package holding portion 22, and the lower case 2 provided with the engaging portion 51 which has the resilient half portion 51a in a half support which is formed on the bottom face portion 2A of the lower case 2 and on which the extrusion portion 51b that engages releasibly with the protrusion engagement portion 50b and the threaded hole 51c for the screw 33 are formed, is disassembled by inserting the screw 33 into the threaded hole 51c so that the end portion of the screw 33 contacts slidably onto the slant face 50a so as to move the resilient half portion 51a downwardly away from the upper case 1 to release the engagement of the extrusion portion 51b and the protrusion engagement portion 50b so that it is possible to move rearwardly the lower case 2 in relation to the upper case 1, and pulling out the lower case 2 from the upper case 1 resulting in dismounting of the lower case 2 from the upper case 1. Therefore, this method improves the disassembling workability to dismount the housing of the upper case 1 and the lower case 2 by means of the screw 33 with which the lower case 2 is provided.

What is claimed is:

1. A housing structure of an electric appliance comprising:

an upper case provided with a plurality of holding portions arranged on inner sides of left and right side face portions of the upper case in front-and-rear directions, a first upper case side engagement portion formed on at least one of said holding portions, and a second upper case side engagement portion; and a lower case provided with a first lower case side engagement portion to engage releasibly with the first upper case side engagement portion, a release of the first lower case side engagement portion from the upper case side engagement portion being achieved by means of turning a screw, a second lower case side engagement portion to engage releasibly with the second upper case side engagement portion, and hooks, formed at front portions of the left and right sides of the lower case, which are adapted to hook a frontmost holding portion in order to position the lower case to overlap with the upper case such that pushing the lower case against the upper case results in an engagement of the first upper case side engagement portion with the first lower case side engagement portion and the second upper case side engagement portion with the second lower case side engagement portion.

2. The housing structure of the electric appliance according to claim 1, wherein the first upper case side engagement portion of the upper case has a rearwardly slanted face formed on an end face of said one of said holding portions, said slanted face and a front face of said one of said holding portions forming a protrusion engagement portion, and the first lower case side engagement portion of the lower case has a resilient half portion in a half support which is formed on a bottom face of the lower case and on which an extrusion portion that engages releasibly with the protrusion engagement portion and a threaded hole for the screw are formed.

3. The housing structure of the electric appliance according to claim 2, wherein said holding portions arranged in front-and-rear directions at a regular interval.

4. A method of disassembling a housing structure of an electric appliance having an upper case provided with a plurality of holding portions arranged on inner sides of left and right side face portions of the upper case in front-and-rear directions and a first upper case side engagement portion, formed on one of said holding portions, which has a rearwardly slanted face formed on an end face of said one holding portion, said slanted face and a front face of said one holding portion forming a protrusion engagement portion, and a lower case provided with a first lower case side engagement portion which has a resilient half portion in a half support which is formed on the bottom face of the lower case and on which an extrusion portion that engages releasibly with the protrusion engagement portion and a threaded hole for a screw are formed, said method comprising steps of:

inserting the screw into the threaded hole;

screwing the screw into the threaded hole so that an end portion of the screw contacts slidably onto the slant face so as to move the resilient half portion downwardly away from the upper case to release the engagement of the extrusion portion and the protrusion engagement portion; and pulling out the lower case from the upper case resulting in dismounting of the lower case from the upper case.

5. A housing structure of an electric appliance comprising:

an upper case provided with a plurality of holding portions arranged on inner sides of left and right side face portions of the upper case, one of said holding portions having a protrusion engagement portion defined by a slant face and a front face of said one holding portion; and a lower case provided with a lower case side engagement portion which engages releasibly with the protrusion engagement portion, the lower case side engagement portion having a resilient half portion in a half support which is formed on a bottom face of the lower case and on which an extrusion portion that engages releasibly with the protrusion engagement portion and a threaded hole for a screw are formed.

* * * * *